(12) United States Patent
Pan et al.

(10) Patent No.: US 10,892,715 B2
(45) Date of Patent: Jan. 12, 2021

(54) WIDEBAND POWER COMBINER AND SPLITTER

(71) Applicant: Skyworks Solutions, Inc., Irvine, CA (US)

(72) Inventors: Bo Pan, Irvine, CA (US); Aleksey A. Lyalin, Moorpark, CA (US); Weimin Sun, Santa Rosa Valley, CA (US); Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/874,397

(22) Filed: May 14, 2020

(65) Prior Publication Data

US 2020/0336113 A1 Oct. 22, 2020

Related U.S. Application Data

(63) Continuation of application No. 16/190,720, filed on Nov. 14, 2018, now Pat. No. 10,693,422.

(Continued)

(51) Int. Cl.
*H03F 1/02* (2006.01)
*H03F 3/193* (2006.01)
(Continued)

(52) U.S. Cl.
CPC .......... *H03F 1/0288* (2013.01); *H03F 3/193* (2013.01); *H03F 3/211* (2013.01); *H03F 3/604* (2013.01);
(Continued)

(58) Field of Classification Search
CPC ........ H03F 1/0288; H03F 3/211; H03F 3/193; H03F 3/604; H03F 2203/21142;
(Continued)

(56) References Cited

U.S. PATENT DOCUMENTS 5,334,957 A 8/1994 Koontz
7,764,120 B2 7/2010 Pengelly
(Continued)

FOREIGN PATENT DOCUMENTS

KR 10-2017-0066915 A 6/2017
WO WO 2005/031967 A1 4/2005

OTHER PUBLICATIONS

Anaren, Syracuse, NY, "Xinger®—III Doherty Combiner Offers Advantages Over a PCB Combiner," Apr. 10, 2011, downloaded from www.microwavejournal.com/articles/10947-xinger-iii-doherty-combiner-offers-advantages-over-a-pcb-combiner.
(Continued)

*Primary Examiner* — Robert J Pascal
*Assistant Examiner* — Kimberly E Glenn
(74) *Attorney, Agent, or Firm* — Knobbe, Martens, Olson & Bear, LLP

(57) ABSTRACT

Wideband power combiners and splitters are provided herein. In certain embodiments, a power combiner/splitter is implemented with a first coil connecting a first port and a second port, and a second coil connecting a third port and a fourth port. The first coil and the second coil are inductively coupled to one another. For example, the first coil and the second coil can be formed using adjacent conductive layers of a semiconductor chip, an integrated passive device, or a laminate. The power combiner/splitter further includes a fifth port tapping a center of the first coil and a sixth port tapping a center of the second coil. The fifth port and the sixth port serve to connect capacitors and/or other impedance to the center of the coils to thereby provide wideband operation.

20 Claims, 31 Drawing Sheets

Related U.S. Application Data

(60) Provisional application No. 62/590,934, filed on Nov. 27, 2017.

(51) Int. Cl.
*H03F 3/21* (2006.01)
*H03F 3/60* (2006.01)

(52) U.S. Cl.
CPC .... *H03F 2200/06* (2013.01); *H03F 2200/451* (2013.01); *H03F 2203/21106* (2013.01); *H03F 2203/21142* (2013.01)

(58) Field of Classification Search
CPC ............. H03F 200/06; H03F 2200/451; H03F 2206/21106
See application file for complete search history.

(56) References Cited

U.S. PATENT DOCUMENTS

| | | |
|---|---|---|
| 10,554,177 B2 | 2/2020 | Lyalin et al. |
| 10,693,422 B2 | 6/2020 | Pan et al. |
| 2004/0092245 A1 | 5/2004 | Katz |
| 2007/0205827 A1 | 9/2007 | Mobbs |
| 2009/0027129 A1 | 1/2009 | Sims, III et al. |
| 2010/0277253 A1 | 11/2010 | Mui |
| 2011/0080153 A1 | 4/2011 | Metzger et al. |
| 2011/0169590 A1 | 7/2011 | Namerikawa et al. |
| 2012/0049961 A1 | 3/2012 | Ripley et al. |
| 2012/0222892 A1 | 9/2012 | Sun et al. |
| 2012/0223422 A1 | 9/2012 | Sun et al. |
| 2012/0235734 A1 | 9/2012 | Pengelly |
| 2013/0027272 A1 | 1/2013 | Karthaus |
| 2013/0344825 A1 | 12/2013 | Ripley et al. |
| 2014/0002188 A1 | 1/2014 | Chen et al. |
| 2014/0028521 A1 | 1/2014 | Bauder et al. |
| 2014/0175629 A1 | 6/2014 | Sun et al. |
| 2014/0240039 A1 | 8/2014 | Pengelly |
| 2014/0320205 A1 | 10/2014 | Lyalin et al. |
| 2014/0320252 A1 | 10/2014 | Sun et al. |
| 2015/0044863 A1 | 2/2015 | Sun et al. |
| 2015/0061092 A1 | 3/2015 | Sun et al. |
| 2015/0303971 A1 | 10/2015 | Reisner et al. |
| 2015/0326181 A1 | 11/2015 | Chen et al. |
| 2015/0326182 A1 | 11/2015 | Chen et al. |
| 2015/0326183 A1 | 11/2015 | Chen et al. |
| 2015/0349741 A1 | 12/2015 | Lehtola |
| 2015/0365112 A1 | 12/2015 | Alon et al. |
| 2016/0043458 A1 | 2/2016 | Sun et al. |
| 2016/0049910 A1 | 2/2016 | Datta et al. |
| 2016/0080011 A1 | 3/2016 | Sun et al. |
| 2016/0080012 A1 | 3/2016 | Sun et al. |
| 2016/0087589 A1 | 3/2016 | Lehtola |
| 2016/0093578 A1 | 3/2016 | Penunuri |
| 2016/0093948 A1 | 3/2016 | Lehtola |
| 2016/0094189 A1 | 3/2016 | Lyalin |
| 2016/0118944 A1 | 4/2016 | Datta et al. |
| 2016/0164474 A1 | 6/2016 | Lizarraga |
| 2016/0191001 A1 | 6/2016 | Ripley et al. |
| 2016/0191002 A1 | 6/2016 | Ripley et al. |
| 2016/0191086 A1 | 6/2016 | Ripley et al. |
| 2016/0218682 A1 | 7/2016 | Lyalin et al. |
| 2016/0218693 A1 | 7/2016 | Lyalin |
| 2016/0241194 A1 | 8/2016 | Lehtola |
| 2016/0241195 A1 | 8/2016 | Lehtola et al. |
| 2016/0241196 A1 | 8/2016 | Lehtola |
| 2016/0241197 A1 | 8/2016 | Pehlke et al. |
| 2016/0241202 A1 | 8/2016 | Lehtola et al. |
| 2016/0241203 A1 | 8/2016 | Lehtola et al. |
| 2016/0241205 A1 | 8/2016 | Lehtola |
| 2016/0241206 A1 | 8/2016 | Lehtola |
| 2016/0241207 A1 | 8/2016 | Lehtola |
| 2016/0241208 A1 | 8/2016 | Lehtola |
| 2016/0241209 A1 | 8/2016 | Lehtola |
| 2016/0241295 A1 | 8/2016 | Lyalin |
| 2016/0242057 A1 | 8/2016 | Ripley et al. |
| 2016/0248379 A1 | 8/2016 | Lehtola |
| 2016/0248384 A1 | 8/2016 | Lehtola |
| 2016/0248389 A1 | 8/2016 | Lehtola |
| 2016/0254838 A1 | 9/2016 | Reisner et al. |
| 2016/0336979 A1 | 11/2016 | Alon et al. |
| 2016/0380594 A1 | 12/2016 | Sun et al. |
| 2017/0019076 A1 | 1/2017 | Ripley et al. |
| 2017/0026002 A1 | 1/2017 | Lyalin |
| 2017/0026005 A1 | 1/2017 | Ripley et al. |
| 2017/0040953 A1 | 2/2017 | Lizarraga et al. |
| 2017/0069584 A1 | 3/2017 | Sun et al. |
| 2017/0077892 A1 | 3/2017 | Thorup |
| 2017/0141734 A1 | 5/2017 | Lehtola |
| 2017/0194919 A1 | 7/2017 | Lehtola |
| 2017/0207752 A1 | 7/2017 | Lehtola |
| 2017/0230075 A1 | 8/2017 | Sun et al. |
| 2017/0250727 A1 | 8/2017 | Lehtola |
| 2017/0257070 A1 | 9/2017 | Modi et al. |
| 2017/0302230 A1 | 10/2017 | Lehtola et al. |
| 2017/0302231 A1 | 10/2017 | Ripley et al. |
| 2017/0317653 A1 | 11/2017 | Lehtola et al. |
| 2017/0324136 A1 | 11/2017 | Sun et al. |
| 2017/0338781 A1 | 11/2017 | Lyalin et al. |
| 2017/0338847 A1 | 11/2017 | Reisner et al. |
| 2018/0006626 A1 | 1/2018 | Lyalin et al. |
| 2018/0026594 A1 | 1/2018 | Lehtola |
| 2018/0097483 A1 | 4/2018 | Lehtola |
| 2018/0145636 A1 | 5/2018 | Datta et al. |
| 2018/0159577 A1 | 6/2018 | Pehlke et al. |
| 2018/0183389 A1 | 6/2018 | Lehtola et al. |
| 2018/0226925 A1 | 8/2018 | Lyalin |
| 2018/0241360 A1 | 8/2018 | Lehtola |
| 2018/0262162 A1 | 9/2018 | Lyalin |
| 2018/0323758 A1 | 11/2018 | Lyalin et al. |
| 2018/0358338 A1 | 12/2018 | Penunuri et al. |

OTHER PUBLICATIONS

Chiang, Yi-Chyung, et al., Design of a Wide-Band Lumped-Element 3-dB Quadrature Coupler, IEEE Transactions on Microwave Theory and Techniques, vol. 49, No. 3, Mar. 2001, pp. 476-479.

Frye, Robert C., et al., "A 2-GHz Quadrature Hybrid Implemented in CMOS Technology," IEEE Journal of Solid-State Circuits, vol. 38, No. 3, Mar. 2003, pp. 550-555.

International Search Report and Written Opinion of the International Searching Authority for International Application No. PCT/US2018/061144 dated Feb. 27, 2019, in 7 pages.

Maas, Steve, "Designing VHF Lumped-Element Couplers with MW Office," Applied Wave Research, Inc. 1999.

Park, Jong Seok, et al., "A Transformer-Based Poly-Phase Network for Ultra-Broadband Quadrature Signal Generation," IEEE 2015.

Pozar, David M., Microwave Engineering, Fourth edition., 2012, pp. 343-346.

Tung, Wei-Shi, et al., "Design of Microwave Wide-Band Quadrature Hybrid using Planar Transformer Coupling Method," IEEE Transactions on Microwave Theory and Techniques, vol. 51, No. 7, Jul. 2003, pp. 1852-1856.

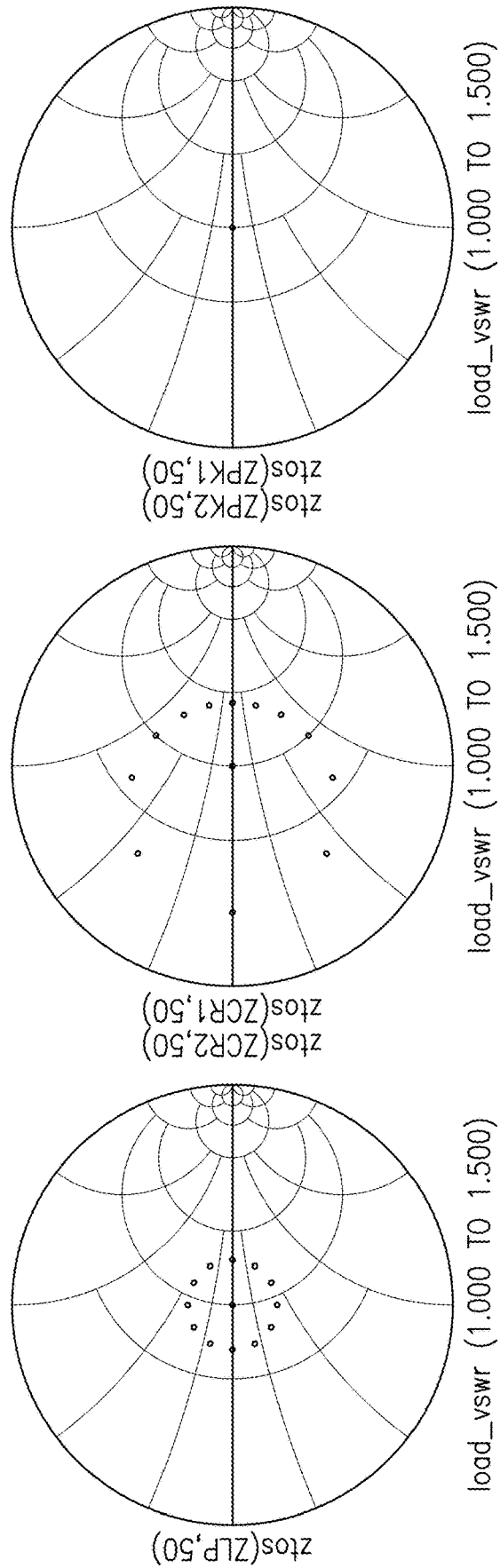

WIDEBAND POWER COMBINER AND SPLITTER

CROSS-REFERENCE TO RELATED APPLICATIONS

This application is a Continuation of U.S. application Ser. No. 16/190,720, filed Nov. 14, 2018 and titled "WIDEBAND POWER COMBINER AND SPLITTER," which claims the benefit of priority under 35 U.S.C. § 119 of U.S. Provisional Patent Application No. 62/590,934, filed Nov. 27, 2017 and titled "WIDEBAND POWER COMBINER AND SPLITTER," which is herein incorporated by reference in its entirety.

BACKGROUND

Field

Embodiments of the invention relate to electronic systems, and in particular, to radio frequency (RF) electronics.

Description of the Related Technology

Power amplifiers can be used to boost or amplify a radio frequency (RF) signal. Thereafter, the boosted RF signal can be used for a variety of purposes, including, for example, driving an antenna of an RF communication system.

Power amplifiers can be included in a wide variety of communication devices, including, but not limited to, mobile phones, tablets, base stations, network access points, laptops, computers, and televisions. Power amplifiers provide amplification to RF signals, which can have a frequency in the range of about 30 kHz to 300 GHz, such as in the range of about 500 MHz to about 6 GHz for certain communications standards.

SUMMARY

In certain embodiments, the present disclosure relates to a power combiner/splitter. The power combiner/splitter includes an input port, a thru port, a first conductive coil connecting the input port to the thru port, an isolation port adjacent to the input port, a coupling port adjacent to the thru port, a second conductive coil connecting the isolation port to the coupling port, a first center tap port tapping a center of the first conductive coil, and a second center tap port tapping a center of the second conductive coil. The second conductive coil is inductively coupled to the first conductive coil.

In some embodiments, the power combiner/splitter further includes a first capacitor connected between the input port and the isolation port, and a second capacitor connected between the thru port and the coupling port. According to several embodiments, the power combiner/splitter further includes a third capacitor connected between the first center tap port and a reference voltage, and a fourth capacitor connected between the second center tap and the reference voltage.

In a number of embodiments, the first conductive coil and the second conductive coil are interleaved.

In several embodiments, the input port and the isolation port and directly adjacent to one another with no intervening ports, and the thru port and the coupling port and directly adjacent to one another with no intervening ports.

In various embodiments, the first center tap port is directly adjacent to the isolation port with no intervening ports, and the second center tap port is directly adjacent to the isolation port with no intervening ports.

In certain embodiments, the present disclosure relates to a radio frequency system for combining signals. The radio frequency system includes a first radio frequency circuit configured to generate a first radio frequency signal, a second radio frequency circuit configured to generate a second radio frequency, and a power combiner configured to generate a radio frequency output signal based on combining the first radio frequency signal and the second radio frequency signal. The power combiner includes a first port configured to output the radio frequency output signal, a second port configured to receive the first radio frequency signal, a third port adjacent to the first port, a fourth port configured to receive the second radio frequency signal, a first conductive coil connecting the first port to the second port, a second conductive coil connecting the third port to the fourth port, a fifth port that taps a center of the first conductive coil, and a sixth port that taps a center of the second conductive coil.

In various embodiments, the power combiner further includes a first capacitor connected between the first port and the third port, and a second capacitor connected between the second port and the fourth port. According to a number of embodiments, the power combiner further includes a third capacitor connected between the fifth port and a reference voltage, and a fourth capacitor connected between the sixth port and the reference voltage.

In several embodiments, the first conductive coil and the second conductive coil are interleaved.

In a number of embodiments, the first port and the third port and directly adjacent to one another with no intervening ports, and the second port and the fourth port and directly adjacent to one another with no intervening ports.

In various embodiments, the fifth port is directly adjacent to the third port with no intervening ports, and the sixth port is directly adjacent to the fourth port with no intervening ports.

According to a number of embodiments, the first radio frequency circuit is a peaking amplification stage of a Doherty amplifier, and the second radio frequency circuit is a carrier amplification stage of a Doherty amplifier.

In certain embodiments, the present disclosure relates to a radio frequency system for splitting signals. The radio frequency system includes a power splitter configured to generate a first split signal and a second split signal based on splitting a radio frequency input signal, the power splitter including a first port configured to receive the radio frequency input signal, a second port configured to output the first split signal, a third port adjacent to the first port, a fourth port configured to output the second split signal, a first conductive coil connecting the first port to the second port, a second conductive coil connecting the third port to the fourth port, a fifth port that taps a center of the first conductive coil, and a sixth port that taps a center of the second conductive coil. The radio frequency system further includes a first radio frequency circuit configured to receive the first split signal, and a second radio frequency circuit configured to receive the second split signal.

In various embodiments, the power splitter further includes a first capacitor connected between the first port and the third port, and a second capacitor connected between the second port and the fourth port.

In several embodiments, the power combiner further includes a third capacitor connected between the fifth port and a reference voltage, and a fourth capacitor connected between the sixth port and the reference voltage.

In a number of embodiments, the first conductive coil and the second conductive coil are interleaved.

In various embodiments, the first port and the third port and directly adjacent to one another with no intervening ports, and the second port and the fourth port and directly adjacent to one another with no intervening ports.

In some embodiments, the fifth port is directly adjacent to the third port with no intervening ports, and the sixth port is directly adjacent to the fourth port with no intervening ports.

In various embodiments, the first radio frequency circuit is a peaking amplification stage of a Doherty amplifier, and the second radio frequency circuit is a carrier amplification stage of a Doherty amplifier.

In certain embodiments, the present disclosure relates to power combiner/splitter. The power combiner/splitter includes an input port, a thru port, a first conductive coil connecting the input port to the thru port, an isolation port adjacent to the input port, a coupling port adjacent to the thru port, a second conductive coil connecting the isolation port to the coupling port and inductively coupled to the first conductive coil, a first center tap port connected to about a center of the first conductive coil, and a second center tap port connected to about a center of the second conductive coil.

In various embodiments, the power combiner/splitter further includes a first capacitor connected between the input port and the isolation port, and a second capacitor connected between the thru port and the coupling port. According to several embodiments, the power combiner/splitter further includes a third capacitor connected between the first center tap port and a reference voltage, and a fourth capacitor connected between the second center tap and the reference voltage. In accordance with a number of embodiments, the reference voltage is ground.

In some embodiments, the input port and the isolation port and directly adjacent to one another with no intervening ports.

In various embodiments, the thru port and the coupling port and directly adjacent to one another with no intervening ports.

In a number of embodiments, the first conductive coil and the second conductive coil are interleaved.

In several embodiments, the first center tap port is directly adjacent to the isolation port with no intervening ports.

In various embodiments, the second center tap port is directly adjacent to the isolation port with no intervening ports.

In some embodiments, the power combiner/splitter is implemented in a Doherty amplifier.

In various embodiments, the power combiner/splitter is implemented in a quadrature combined Doherty amplifier.

In a number of embodiments, the first conductive coil and the second conductive coil are each substantially shaped as a figure eight.

In several embodiments, the power combiner/splitter is implemented as an integrated passive device.

In some embodiments, the power combiner/splitter is implemented in a laminate.

In various embodiments, the input port, the thru port, the isolation port, the coupling port, the first center tap port, and the second center tap are each connected to a different pad of a semiconductor die.

In certain embodiments, the present disclosure relates to a radio frequency system for combining signals. The radio frequency system includes a first radio frequency circuit configured to generate a first radio frequency signal, a second radio frequency circuit configured to generate a second radio frequency, and a power combiner configured to generate a radio frequency output signal based on combining the first radio frequency signal and the second radio frequency signal. The power combiner includes a first port configured to output the radio frequency output signal, a second port configured to receive the first radio frequency signal, a third port adjacent to the first port, a fourth port configured to receive the second radio frequency signal, a first conductive coil connecting the first port to the second port, a second conductive coil connecting the third port to the fourth port, a fifth port that taps the first conductive coil, and a sixth port that taps the second conductive coil.

In a number of embodiments, the first radio frequency circuit is a peaking amplification stage of a Doherty amplifier, and the second radio frequency circuit is a carrier amplification stage of a Doherty amplifier.

In some embodiments, the power combiner further includes a first capacitor connected between the first port and the third port, and a second capacitor connected between the second port and the fourth port. According to several embodiments, the power combiner further includes a third capacitor connected between the fifth port and a reference voltage, and a fourth capacitor connected between the sixth port and the reference voltage. In accordance with a number of embodiments, the reference voltage is ground.

In various embodiments, the first port and the third port and directly adjacent to one another with no intervening ports.

In a number of embodiments, the second port and the fourth port and directly adjacent to one another with no intervening ports.

In several embodiments, the first conductive coil and the second conductive coil are interleaved.

In some embodiments, the fifth port is directly adjacent to the third port with no intervening ports.

In various embodiments, the sixth port is directly adjacent to the fourth port with no intervening ports.

In a number of embodiments, the first conductive coil and the second conductive coil are each substantially shaped as a figure eight.

In several embodiments, the power combiner is implemented as an integrated passive device.

In various embodiments, the power combiner is implemented in a laminate.

In a number of embodiments, the first port, the second port, the third port, the fourth port, the fifth port, and the sixth port are each connected to a different pad of a semiconductor die.

In some embodiments, the fifth port taps the first conductive coil at about a center of the first conductive coil.

In several embodiments, the sixth port taps the second conductive coil at about a center of the second conductive coil.

In a number of embodiments, the radio frequency system is implemented in a mobile device.

In certain embodiments, the present disclosure relates to a radio frequency system for splitting signals. The radio frequency system includes a power splitter configured to generate a first split signal and a second split signal based on splitting a radio frequency input signal. The power splitter includes a first port configured to receive the radio frequency input signal, a second port configured to output the first split signal, a third port adjacent to the first port, a fourth port configured to output the second split signal, a first conductive coil connecting the first port to the second port, a second conductive coil connecting the third port to the fourth port, a fifth port that taps the first conductive coil, and a sixth port that taps the second conductive coil. The radio frequency system further includes a first radio frequency circuit configured to receive the first split signal, and a second radio frequency circuit configured to receive the second split signal.

In some embodiments, the first radio frequency circuit is a peaking amplification stage of a Doherty amplifier, and the second radio frequency circuit is a carrier amplification stage of a Doherty amplifier.

In various embodiments, the power splitter further includes a first capacitor connected between the first port and the third port, and a second capacitor connected between the second port and the fourth port. According to a number of embodiments, the power combiner further includes a third capacitor connected between the fifth port and a reference voltage, and a fourth capacitor connected between the sixth port and the reference voltage. In accordance with several embodiments, the reference voltage is ground.

In some embodiments, the first port and the third port and directly adjacent to one another with no intervening ports.

In several embodiments, the second port and the fourth port and directly adjacent to one another with no intervening ports.

In a number of embodiments, the first conductive coil and the second conductive coil are interleaved.

In several embodiments, the fifth port is directly adjacent to the third port with no intervening ports.

In various embodiments, the sixth port is directly adjacent to the fourth port with no intervening ports.

In some embodiments, the first conductive coil and the second conductive coil are each substantially shaped as a figure eight.

In several embodiments, the power separator is implemented as an integrated passive device.

In a number of embodiments, the power separator is implemented in a laminate.

In various embodiments, the first port, the second port, the third port, the fourth port, the fifth port, and the sixth port are each connected to a different pad of a semiconductor die.

In several embodiments, the fifth port taps the first conductive coil at about a center of the first conductive coil.

In a number of embodiments, the sixth port taps the second conductive coil at about a center of the second conductive coil.

In some embodiments, the radio frequency system is implemented in a mobile device.

In certain embodiments, the present disclosure relates to a quadrature combined Doherty amplifier. The quadrature combined Doherty amplifier includes a separator configured to separate a radio frequency input signal into a first pair of input signal components and a second pair of input signal components, a first Doherty amplifier configured to generate a first pair of amplified signal components based on amplifying the first pair of input signal components, a second Doherty amplifier configured to generate a second pair of amplified signal components based on amplifying the second pair of input signal components, the second Doherty amplifier configured to operate in quadrature with respect to the first Doherty amplifier, and a combiner configured to generate a radio frequency output signal based on combining the first pair of amplified signal components and the second pair of amplified signal components.

In various embodiments, the first Doherty amplifier includes a first pair of cascode amplification stages, and the second Doherty amplifier includes a second pair of cascode amplification stages.

In a number of embodiments, the first Doherty amplifier includes a first carrier amplification stage and a first peaking amplification stage, and the second Doherty amplifier includes a second carrier amplification stage and a second peaking amplification stage.

In several embodiments, the first pair of input signal components have a phase difference of about ninety degrees, and the second pair of input signal components have a phase difference of about ninety degrees.

In some embodiments, the combiner includes a first power combiner configured to generate a first combined signal based on combining the first pair of amplified signal components, a second power combiner configured to generate a second combined signal based on combining the second pair of amplified signal components, and a third power combiner configured to generate the radio frequency output signal based on combining the first combined signal and the second combined signal.

In various embodiments, the combiner includes a first plurality of passive elements configured to generate a first combined signal based on combining the first pair of amplified signal components, a second plurality of passive elements configured to generate a second combined signal based on combining the second pair of amplified signal components, and a power combiner configured to generate the radio frequency output signal based on combining the first combined signal and the second combined signal. According to a number of embodiments, the first plurality of passive elements includes an inductor connected between a peaking output and a carrier output of the first Doherty amplifier, a first capacitor connected between the peaking output and ground, and a second capacitor connected between the carrier output and ground.

In several embodiments, the combiner includes a first pair of quarter wavelength transmission line sections operable to generate a first combined signal based on combining the first pair of amplified signal components, a second pair of quarter wavelength transmission line sections operable to generate a second combined signal based on combining the second pair of amplified signal components, and a power combiner configured to generate the radio frequency output signal based on combining the first combined signal and the second combined signal.

In various embodiments, the separator includes a first power splitter configured to separate the radio frequency input signal into a first separated signal component and a second separated signal component, a second power splitter configured to separate the first separated signal component into the first pair of input signal components, and a third power splitter configured to separate the second separated signal component into the second pair of input signal components.

In a number of embodiments, the separator includes a power splitter and a balun configured to operate in combination with one another to generate the first pair of input signal components and the second pair of input signal components.

In some embodiments, the combiner includes a power combiner including an input port, a thru port, a first conductive coil connecting the input port to the thru port, an isolation port adjacent to the input port, a coupling port adjacent to the thru port, a second conductive coil connecting the isolation port to the coupling port, a first center tap port connected to about a center of the first conductive coil, and a second center tap port connected to about a center of the second conductive coil. According to a number of embodiments, the power combiner further includes a first capacitor connected between the input port and the isolation port, and a second capacitor connected between the thru port and the coupling port. In accordance with several embodiments, the power combiner further includes a third capacitor connected between the first center tap port and a reference voltage, and a fourth capacitor connected between the second center tap and the reference voltage. According to various embodiments, the first conductive coil and the second conductive coil are each substantially shaped as a figure eight. In accordance with a number of embodiments, the first conductive coil and the second conductive coil are interleaved.

In several embodiments, the separator includes a power splitter including an input port, a thru port, a first conductive coil connecting the input port to the thru port, an isolation port adjacent to the input port, a coupling port adjacent to the thru port, a second conductive coil connecting the isolation port to the coupling port, a first center tap port connected to about a center of the first conductive coil, and a second center tap port connected to about a center of the second conductive coil. According to some embodiments, the power splitter further includes a first capacitor connected between the input port and the isolation port, and a second capacitor connected between the thru port and the coupling port. In accordance with various embodiments, the power splitter further includes a third capacitor connected between the first center tap port and a reference voltage, and a fourth capacitor connected between the second center tap and the reference voltage. According to a number of embodiments, the first conductive coil and the second conductive coil are each substantially shaped as a figure eight. In accordance with some embodiments, the first conductive coil and the second conductive coil are interleaved.

BRIEF DESCRIPTION OF THE DRAWINGS

FIG. 22D illustrates a Smith chart of load impedance versus VSWR for another example of a quadrature combined Doherty amplifier in a high power mode.

FIG. 22E illustrates a Smith chart of impedance seen by the carrier amplifiers versus VSWR for another example of a quadrature combined Doherty amplifier in a high power mode.

FIG. 22F illustrates a Smith chart of impedance seen by the peaking amplifiers versus VSWR for another example of a quadrature combined Doherty amplifier in a high power mode.

DETAILED DESCRIPTION OF EMBODIMENTS

Figure 1:
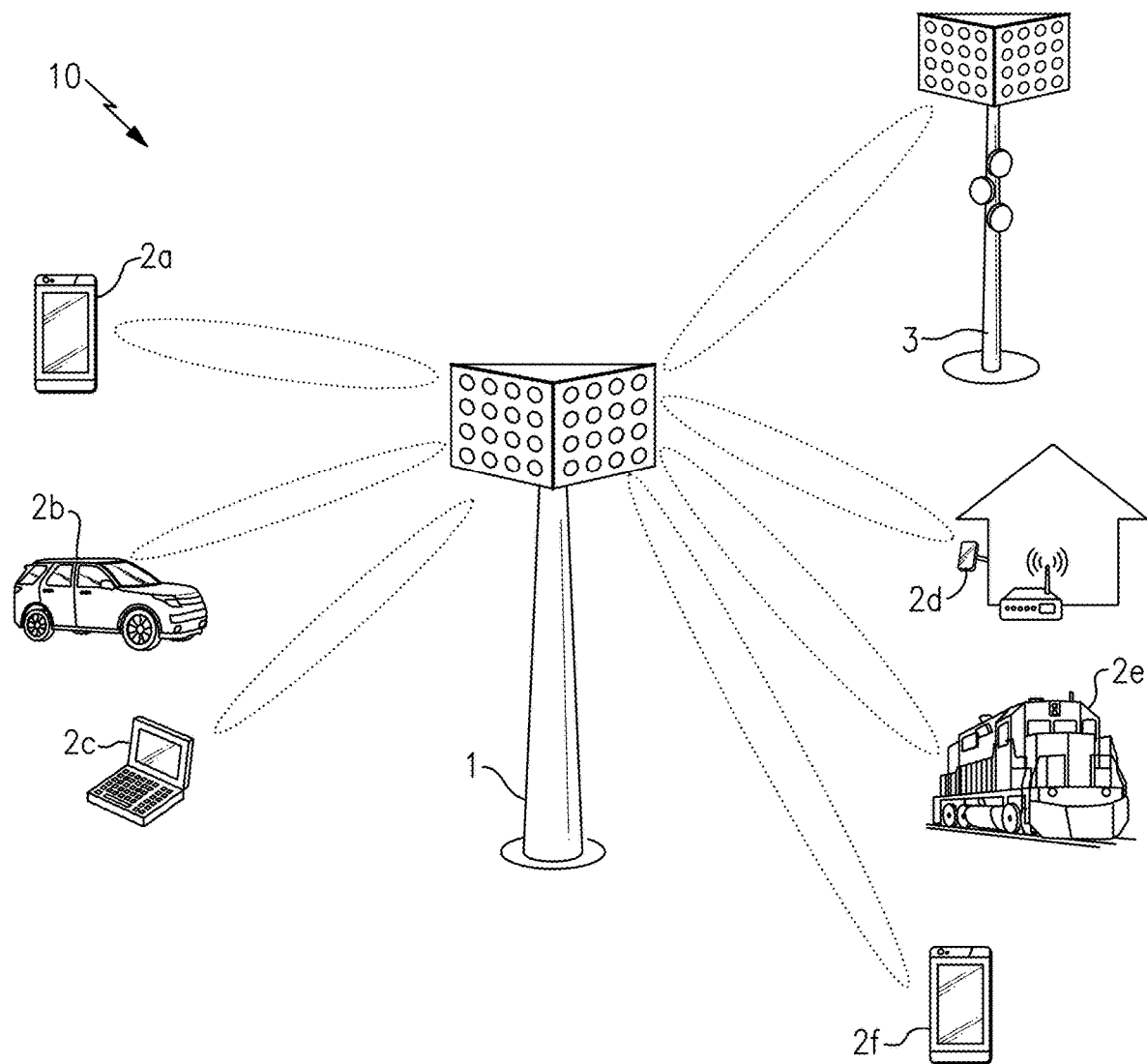
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Examples of Power Combiners/Splitters

A 3 dB hybrid coupler is a four-port device that can be used to split an input signal into two signal components with about equal power and a quadrature phase relationship or to combine two signal components into a combined signal while maintaining high port-to-port isolation.

A wide variety of RF circuits include a 3 dB hybrid coupler for combining or splitting RF signals. For example, one or more instantiations of 3 dB hybrid couplers can be used as power combiners and/or power splitters in a mobile phone, a tablet, a base station, a network access point, a laptop, a television, or other electronic system.

Figure 2:
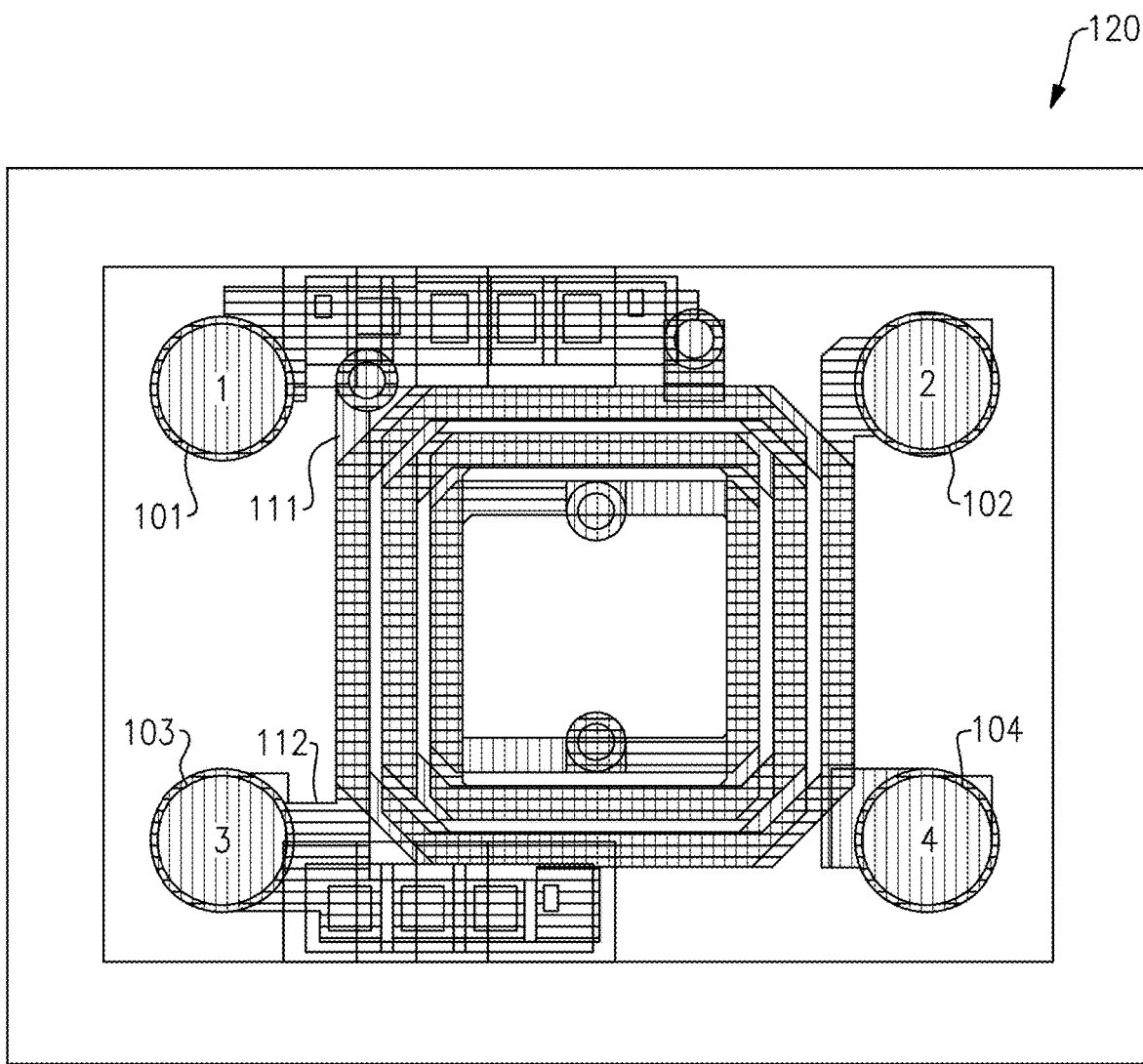
FIG. 2 is a schematic diagram of one example of a 3 dB hybrid coupler for serving as a power combiner or splitter.

FIG. 2 is a schematic diagram of one example of a 3 dB hybrid coupler 120 for serving as a power combiner or splitter. The 3 dB hybrid coupler 120 includes a first terminal or port 101, a second port 102, a third port 103, a fourth port 104, a first conductive coil 111, and a second conductive coil 112. In FIG. 2, different layers of conductive metallization have been represented using different patterns or fills.

In certain implementations, the first port 101 corresponds to an input port (N), the second port 102 corresponds to a thru port (0°), the third port 103 corresponds to an isolation port (ISO), and the fourth port 104 corresponds to a coupling port (90°).

As shown in FIG. 2, the first conductive coil or spiral 111 serves to connect the first port 101 to the second port 102. Additionally, the second conductive coil 112 serves to connect the third port 103 to the fourth port 104. The first conductive coil 111 and the second conductive coil 112 are partially overlaid to provide inductive coupling. Thus, the first conductive coil 111 and the second conductive coil 112 are magnetically or inductively coupled to one another.

The 3 dB hybrid coupler 120 illustrates one example implementation of a power combiner/splitter.

Figure 3:
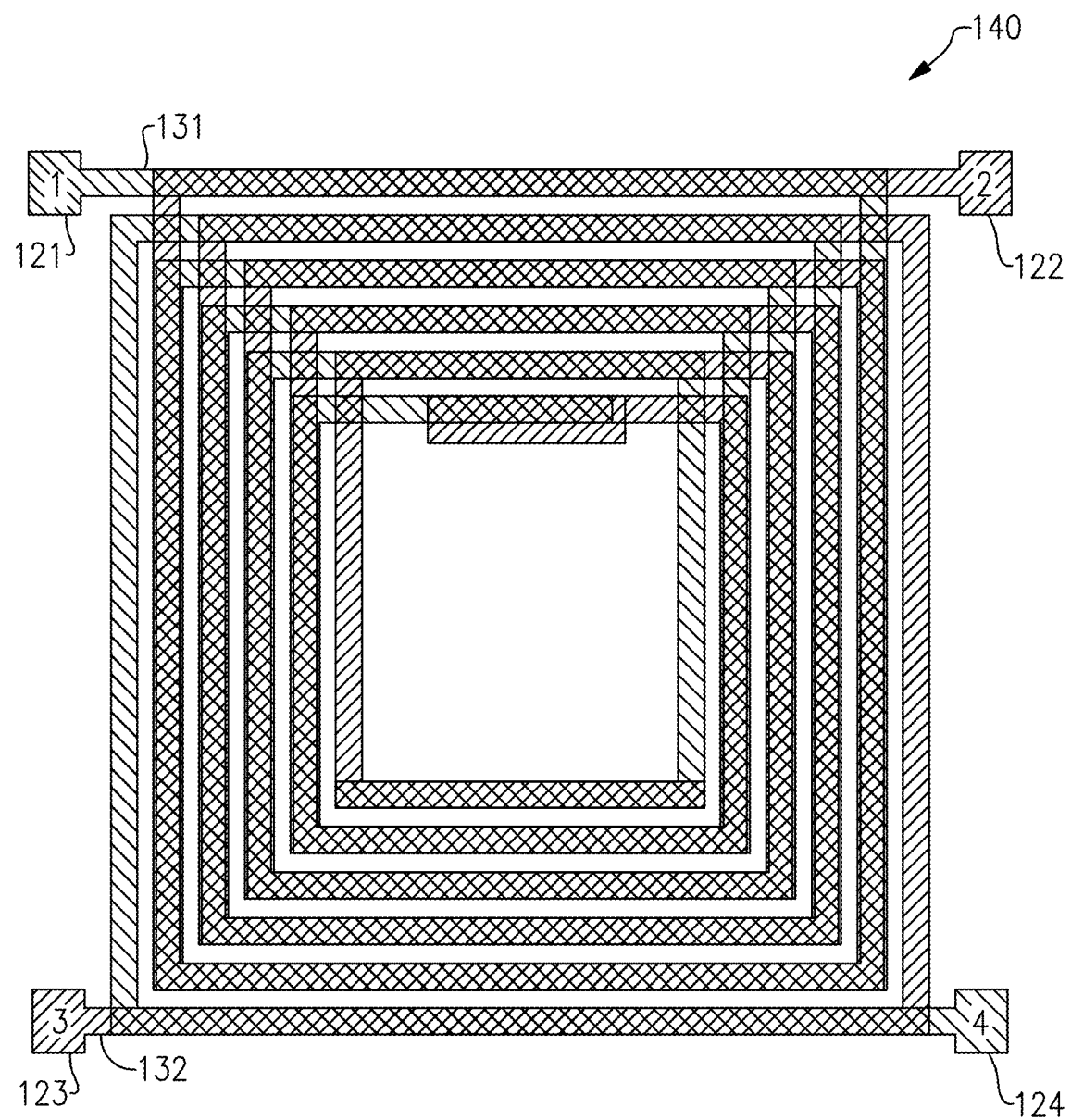
FIG. 3 is a schematic diagram of another example of a 3 dB hybrid coupler for serving as a power combiner or splitter.

FIG. 3 is a schematic diagram of another example of a 3 dB hybrid coupler 140 for serving as a power combiner or splitter. The 3 dB hybrid coupler 140 includes a first terminal or port 121, a second port 122, a third port 123, a fourth port 124, a first conductive coil 131, and a second conductive coil 132. In FIG. 3, different layers of conductive metallization have been represented using different patterns or fills.

In certain implementations, the first port 121 corresponds to an input port (IN), the second port 122 corresponds to a thru port (0°), the third port 123 corresponds to an isolation port (ISO), and the fourth port 124 corresponds to a coupling port (90°).

As shown in FIG. 3, the first conductive coil 131 serves to connect the first port 121 to the second port 122. Additionally, the second conductive coil 132 serves to connect the third port 123 to the fourth port 124. The first conductive coil 131 and the second conductive coil 132 are partially overlaid to provide inductive coupling. Thus, the first conductive coil 131 and the second conductive coil 132 are magnetically or inductively coupled to one another.

The 3 dB hybrid coupler 140 illustrates another example implementation of a power combiner/splitter.

In certain applications, it is desirable for a power combiner/splitter to have a compact layout and to provide wideband operation.

Wideband power combiners and splitters are provided herein. In certain embodiments, a power combiner/splitter is implemented with a first coil connecting a first port and a second port, and a second coil connecting a third port and a fourth port. The first coil and the second coil are inductively coupled to one another. For example, the first coil and the second coil can be formed using adjacent conductive layers of a semiconductor chip, an integrated passive device, or a laminate. The power combiner/splitter further includes a fifth port tapping a center of the first coil and a sixth port tapping a center of the second coil. The fifth port and the sixth port serve to connect capacitors and/or other impedance to the center of the coils to thereby provide wideband operation.

In certain implementations, the first port serve as an input port, the second port serves as a thru port, the third port serves as an isolation port, and the fourth port serves as a coupling port.

To provide wideband operation, capacitors can connect to center taps of each coil to provide tuning to the performance characteristics of the power combiner/splitter.

In certain implementations, a first capacitor is connected between the first port and the third port, a second capacitor is connected between the second port and the fourth port, a third capacitor is connected between the fifth port and a reference voltage (for instance, ground), and a fourth capacitor is connected between the sixth port and the reference voltage.

Accordingly, the power combiner/splitter can operate with a relative small number of external capacitors, for instance, four. In contrast, certain conventional power combiners/splitters operate with nine or more external capacitors.

In certain implementations, the coils are implemented such that the first port and the third port are relatively close in distance to one another (for instance, immediately adjacent ports), and such that the second port and the fourth port are relatively close in distance to one another (for instance, immediately adjacent ports).

By routing the coils in this manner, ports used for combining and separating signals are positioned in relative close proximity, which can aid in providing signal connectivity to other RF circuitry. Additionally, implementing the coils in this manner facilitates connection of the first capacitor between the first port and the third port and of the second capacitor between the second port and the fourth port with low parasitics. Thus, facilitation of connecting cross-coupling capacitors is achieved.

The combiners/splitters can be implemented with integrated quadrature hybrid geometry for wideband operation. The routing of coils can be implemented to put the combining port and the coupling port next to each other to facilitate the connection of a cross-coupling capacitor. In certain configurations, +/−0.15 dB magnitude imbalance of the geometry is greater than about 27%.

In certain implementations, the inter-layer offset can be used to adjust coil mutual coupling co-efficient, thereby achieving wideband operation. Furthermore, coupling level is relatively easy to change for applications in which an unequal coupling level is needed (for instance, uneven power splitting).

The combiners/splitters herein can be implemented in a wide variety of ways, for instance, using semiconductor processing, integrated passive device (IPD) technology, or laminate technology. In certain implementations, the ports of a power combiner/splitter correspond to pins of a semiconductor die or IPD. In other implementations, the ports of a power combiner/splitter correspond to pads of a laminate.

Figure 4:
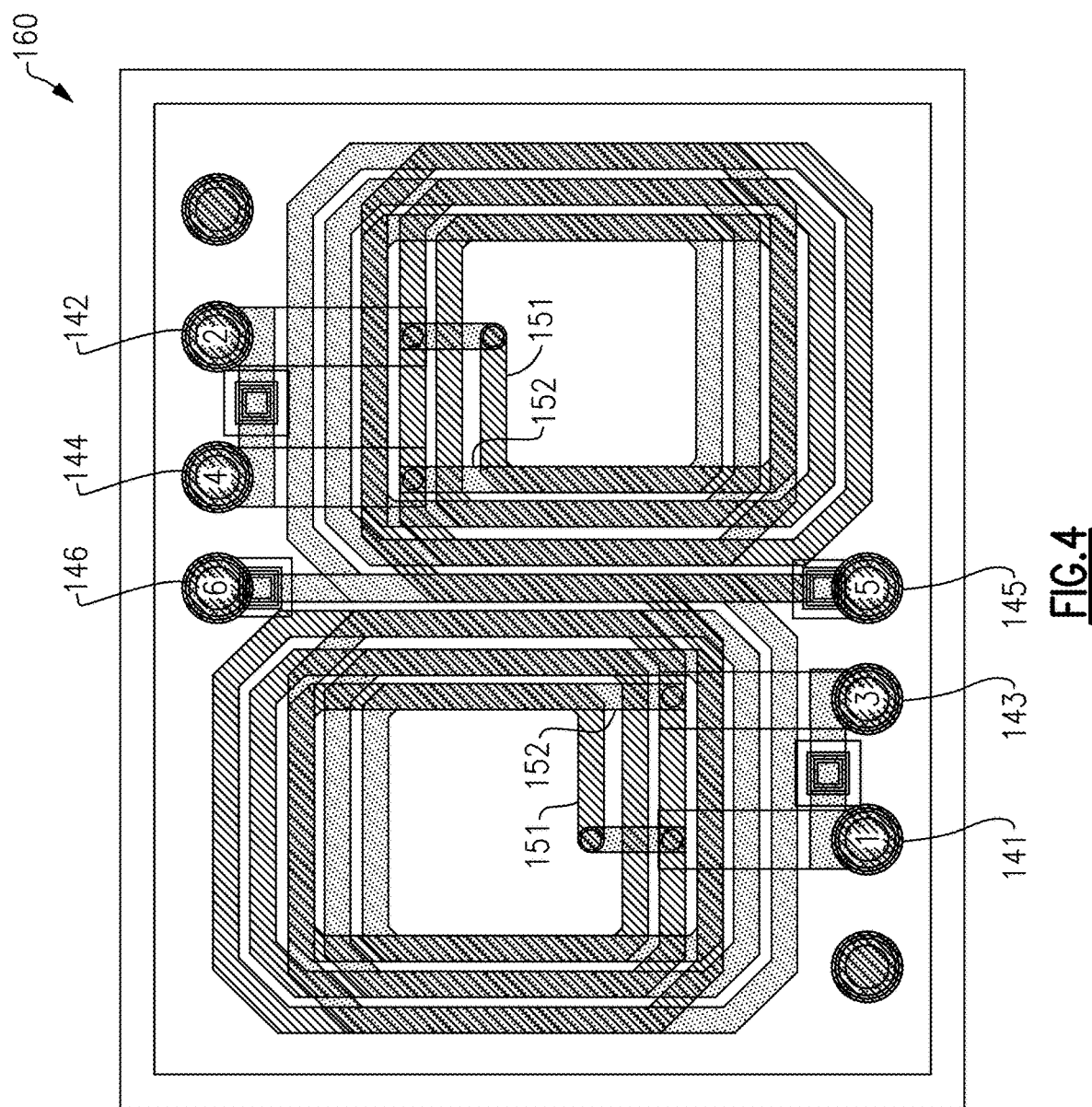
FIG. 4 is a schematic diagram of a power combiner/splitter with coil winding according to one embodiment.

FIG. 4 is a schematic diagram of a power combiner/splitter 160 with coil winding according to one embodiment. The power combiner/splitter 160 includes a first port 141, a second port 142, a third port 143, a fourth port 144, a fifth port 145, a sixth port 146, a first conductive eight-shaped coil 151, and a second conductive eight-shaped coil 152. In FIG. 4, different layers of conductive metallization have been represented using different patterns or fills.

In certain implementations, the first port 141 corresponds to an input port, the second port 142 corresponds to a thru port, the third port 143 corresponds to an isolation port, the fourth port 144 corresponds to a coupling port, the fifth port 145 corresponds to a first coil center tap port, and the sixth port 146 corresponds to a second coil center tap port.

The power combiner/splitter 160 can be used in a wide variety of applications. For example, one or more instantiations of the power combiner/splitter 160 can be used as power combiners and/or power splitters in a mobile phone, a tablet, a base station, a network access point, a laptop, a television, or other electronic system.

As shown in FIG. 4, the first conductive eight-shaped coil 151 serves to connect the first port 141 to the second port 142. Additionally, the second conductive eight-shaped coil 152 serves to connect the third port 143 to the fourth port 144. The first conductive eight-shaped coil 151 and the second conductive eight-shaped coil 152 are partially overlaid to provide inductive coupling.

In the illustrated embodiment, the first conductive eight-shaped coil 151 and the second conductive eight-shaped coil 152 are implemented with a shape that is substantially an eight (8). Furthermore the coils are routed such that the first port 141 is immediately adjacent to the third port 143 and such that the second port 142 is immediately adjacent to the fourth port 144. As shown in FIG. 4, in this embodiment the fifth port 145 is also immediately adjacent to the third port 143, and the sixth port 146 is also immediately adjacent to the fourth port 144.

By routing the coils in this manner, ports used for combining and separating signals are positioned in relative close proximity, which can aid in providing signal connectivity to other RF circuitry. Additionally, implementing the coils in this manner facilitates connection of the first capacitor between the first port and the third port and of the second capacitor between the second port and the fourth port with low parasitics. Thus, facilitation of connecting cross-coupling capacitors is achieved.

Thus, capacitors can be connected to the ports of the power combiner/splitter to provide tuning and/or enhanced bandwidth operation. In certain implementations, a first capacitor is connected between the first port 141 and the third port 143, a second capacitor is connected between the second port 142 and the fourth port 144, a third capacitor is connected between the fifth port 145 and a reference voltage (for instance, ground), and a fourth capacitor is connected between the sixth port 146 and the reference voltage. As shown in FIG. 4, the fifth port 145 connects to a center tap of the first conductive eight-shaped coil 151, and the sixth port 146 connects to a center tap of the second conductive eight-shaped coil 152.

By connecting the capacitors and/or other suitable impedance elements in this manner, enhanced bandwidth of the power combiner/splitter 160 can be achieved. Accordingly, the power combiner/splitter 160 can operate with a relative small number of external capacitors, for instance, four. In contrast, certain conventional power combiners/splitters operate with nine or more external capacitors.

Moreover, the power combiner/splitter 160 has a compact layout, which facilitates integration into an RF system. In certain implementations, the power combiner/splitter 160 is implemented using semiconductor die, IPD, and/or laminate technology (including, but not limited to, a laminated substrate of a multi-chip module). In certain implementations, the ports of the power combiner/splitter 160 correspond to pins of a semiconductor die or IPD. In other implementations, the ports of the power combiner/splitter 160 correspond to pads of a laminate.

In one embodiment, the power combiner/splitter 160 is implemented with a total area of less than 3 mm$^2$, for instance, 1.85 mm×1.5 mm.

Figure 5:
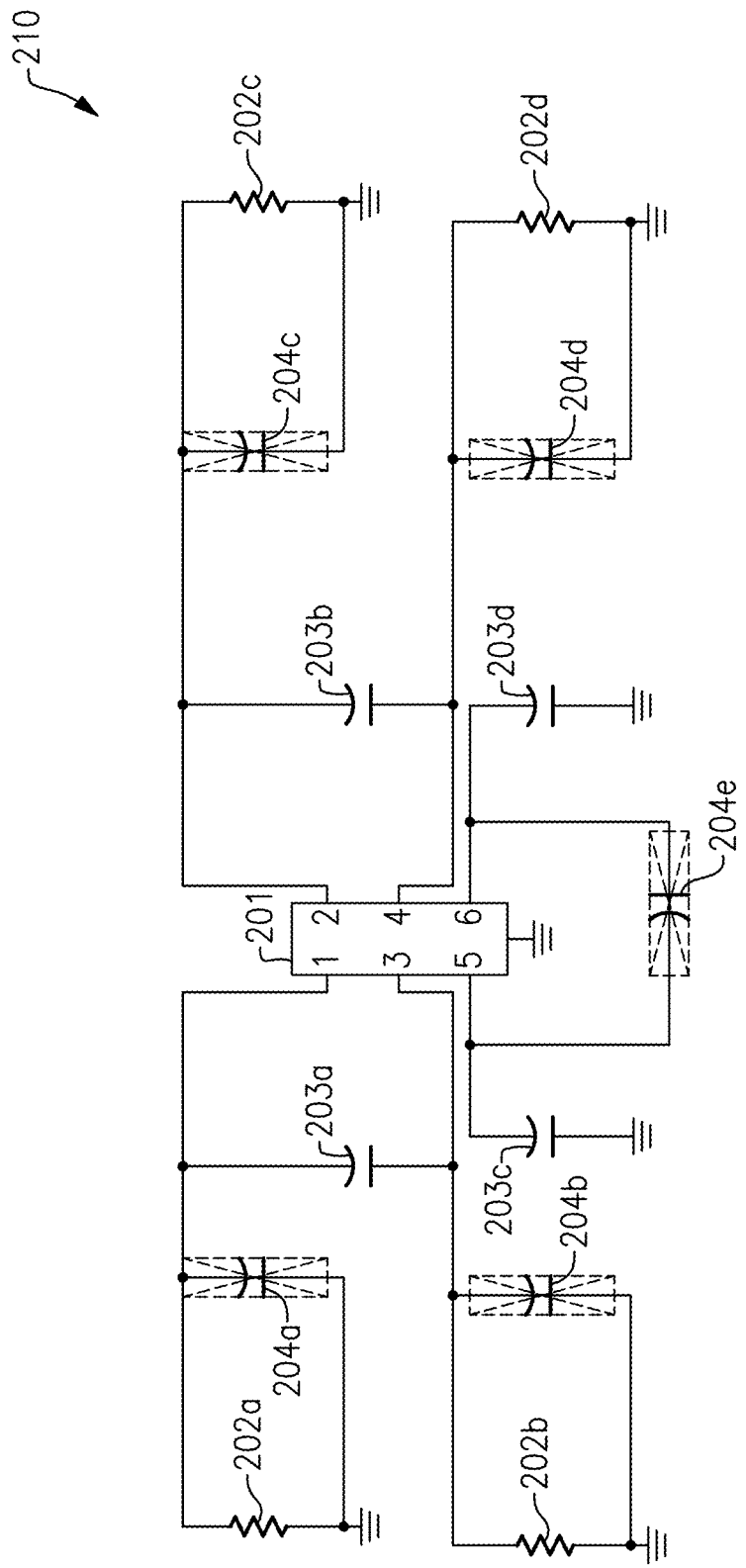
FIG. 5 is a schematic diagram of one embodiment of a power combining/splitting system.

FIG. 5 is a schematic diagram of one embodiment of a power combining/splitting system 210. The power combining/splitting system 210 includes a power combiner/splitter 201, a first termination resistor 202a, a second termination resistor 202b, a third termination resistor 202c, a fourth termination resistor 202d, a first capacitor 203a, a second capacitor 203b, a third capacitor 203c, and a fourth capacitor 203d.

As shown in FIG. 5, the power combiner/splitter 201 includes a first port (1), a second port (2), a third port (3), a fourth port (4), a fifth port (5), and a sixth port (6). In certain implementations, the first port corresponds to an input port, the second port corresponds to a thru port, the third port corresponds to an isolation port, the fourth port corresponds to a coupling port, the fifth port corresponds to a first coil center tap port, and the sixth port corresponds to a second coil center tap port.

The power combiner/splitter 201 can be implemented in a wide variety of ways, including, but not limited to, using any of the embodiments of FIG. 4 or FIGS. 6-8. In certain implementations, the power combiner/splitter 201 is implemented using IPD and/or laminate technology, and the termination resistors 202a-202d and the capacitors 203a-203d correspond to components (for instance, surface mount devices) attached to a laminate.

As shown in FIG. 5, the first capacitor 203a, is connected between the first port and the third port of the power combiner/splitter 201, the second capacitor 203b is connected between the second port and the fourth port of the power combiner/splitter 201, the third capacitor 203c is connected between the fifth port of the power combiner/splitter 201 and ground, and the fourth capacitor 203d is connected between the sixth port of the power combiner/splitter 201 and ground.

As shown in FIG. 5, the combiner/splitter can be implemented with four capacitors to provide wideband operation. Additionally, fifth to ninth capacitors 204a-204e, respectively, need not be included. Rather, such capacitors can be absorbed into a layout of the power combiner/splitter 201, thereby reducing a footprint of the system.

Figure 6:
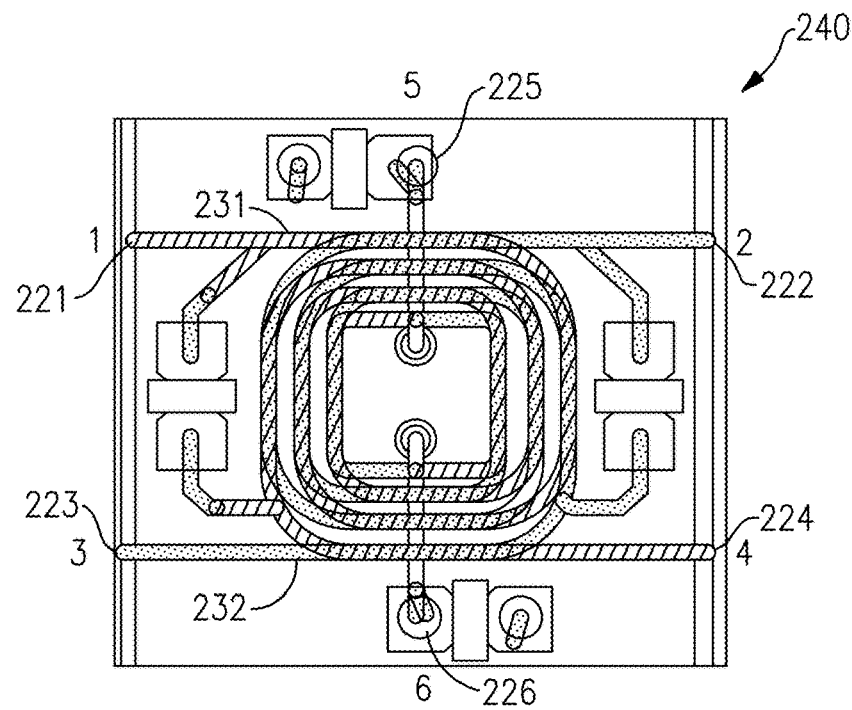
FIG. 6 is a schematic diagram of a power combiner/splitter with coil winding according to another embodiment.

FIG. 6 is a schematic diagram of a power combiner/splitter 240 with coil winding according to another embodiment. The power combiner/splitter 240 includes a first port 221, a second port 222, a third port 223, a fourth port 224, a fifth port 225, a sixth port 226, a first conductive coil 231, and a second conductive coil 232. In FIG. 6, different layers of conductive metallization have been represented using different patterns or fills.

In certain implementations, the first port 221 corresponds to an input port, the second port 222 corresponds to a thru port, the third port 223 corresponds to an isolation port, the fourth port 224 corresponds to a coupling port, the fifth port 225 corresponds to a first coil center tap port, and the sixth port 226 corresponds to a second coil center tap port.

The power combiner/splitter 240 can be used in a wide variety of applications. For example, one or more instantiations of the power combiner/splitter 240 can be used as power combiners and/or power splitters in a mobile phone, a tablet, a base station, a network access point, a laptop, a television, or other electronic system.

As shown in FIG. 6, the first conductive coil 231 serves to connect the first port 221 to the second port 222. Additionally, the second conductive coil 232 serves to connect the third port 223 to the fourth port 224. The first conductive coil 231 and the second conductive coil 232 are partially overlaid to provide inductive coupling.

In the illustrated embodiment, the coils are routed such that the first port 221 is immediately adjacent to the third port 223 and such that the second port 222 is immediately adjacent to the fourth port 224.

By routing the coils in this manner, ports used for combining and separating signals are positioned in relative close proximity, which can aid in providing signal connectivity to other RF circuitry. Additionally, implementing the coils in this manner facilitates connection of the first capacitor between the first port and the third port and of the second capacitor between the second port and the fourth port with low parasitics. Thus, facilitation of connecting cross-coupling capacitors is achieved.

Thus, capacitors can be connected to the ports of the power combiner/splitter to provide tuning and/or enhanced bandwidth operation. In certain implementations, a first capacitor is connected between the first port 221 and the third port 223, a second capacitor is connected between the second port 222 and the fourth port 224, a third capacitor is connected between the fifth port 225 and a reference voltage, and a fourth capacitor is connected between the sixth port 226 and the reference voltage. As shown in FIG. 6, the fifth port 225 connects to a center tap of the first conductive coil 231, and the sixth port 226 connects to a center tap of the second conductive coil 232.

By connecting the capacitors and/or other suitable impedance elements in this manner, enhanced bandwidth of the power combiner/splitter 240 can be achieved. Accordingly, the power combiner/splitter 240 can operate with a relative small number of external capacitors, for instance, four. In contrast, certain conventional power combiners/splitters operate with nine or more external capacitors.

Moreover, the power combiner/splitter 240 has a compact layout, which facilitates integration into an RF system. In certain implementations, the power combiner/splitter 240 is implemented using semiconductor die, IPD, and/or laminate technology.

Figure 7:
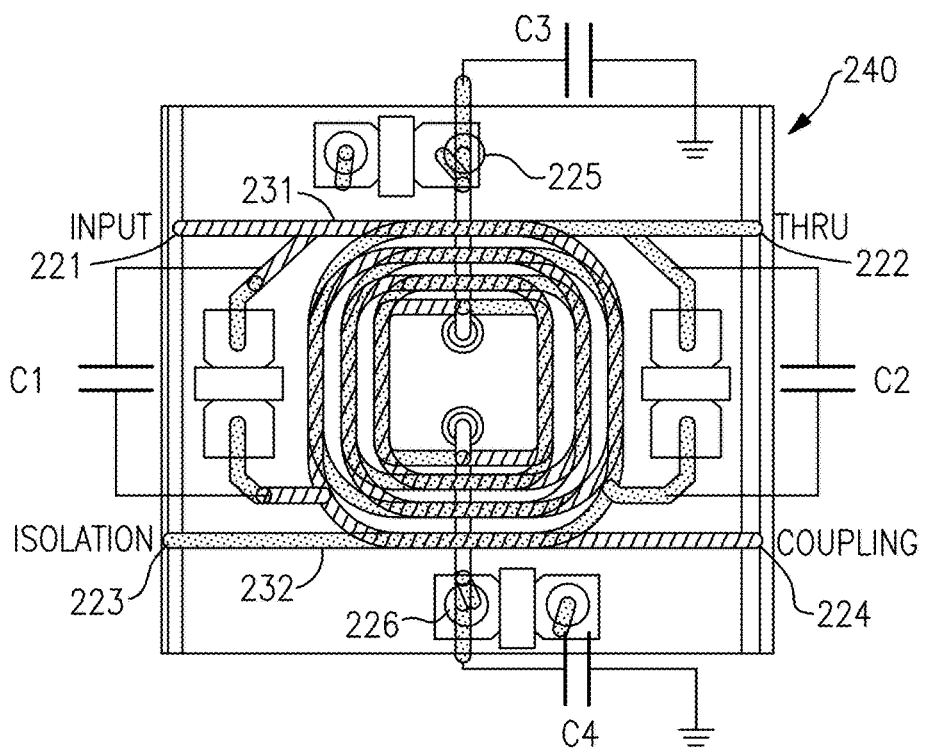
FIG. 7 is a schematic diagram of another embodiment of a power combiner/splitter with connected capacitors for broadband operation.

FIG. 7 is a schematic diagram of another embodiment of a power combiner/splitter 240 with connected capacitors for broadband operation.

As shown in FIG. 7, a first capacitor C1 is connected between the first port 221 and the third port 223. Additionally, a second capacitor C2 is connected between the second port 222 and the fourth port 224. Furthermore, a third capacitor C3 is connected between the fifth port 225 and ground, and a fourth capacitor C4 is connected between the sixth port 226 and ground.

In the illustrated embodiment, the first port corresponds to an input port, the second port corresponds to a thru port, the third port corresponds to an isolation port, the fourth port corresponds to a coupling port, the fifth port corresponds to a first coil center tap port, and the sixth port corresponds to a second coil center tap port.

Figure 8:
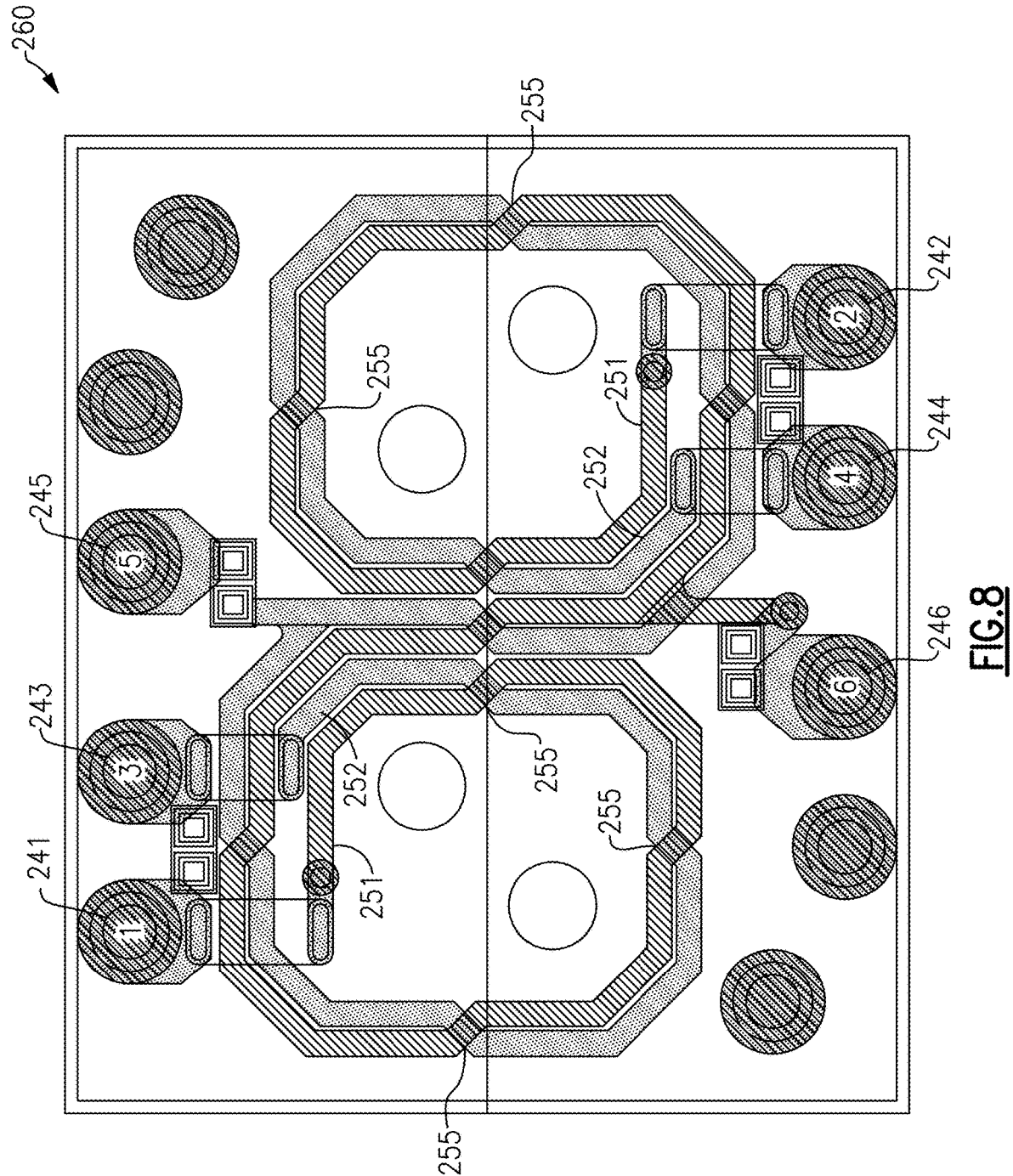
FIG. 8 is a schematic diagram of a power combiner/splitter with coil winding according to another embodiment.

FIG. 8 is a schematic diagram of a power combiner/splitter 260 with coil winding according to another embodiment. The power combiner/splitter 260 includes a first port 241, a second port 242, a third port 243, a fourth port 244, a fifth port 245, a sixth port 246, a first conductive eight-shaped coil 251, and a second conductive eight-shaped coil 252. In FIG. 8, different layers of conductive metallization have been represented using different patterns or fills.

The power combiner/splitter 260 of FIG. 8 is similar to the power combiner/splitter 160 of FIG. 4, except that the power combiner/splitter 260 includes a different implementation of routing of the first conductive eight-shaped coil 251 and the second conductive eight-shaped coil 252.

As shown in FIG. 8, the coils are routed to include cross-overs 255 to thereby provide interleaving of the coils. Implementing the coils with the cross-overs 255 in this manner provides a number of advantages, such as reduced process variations and/or lower performance variation over frequency.

The power combiners/splitters described above can be implemented in a wide variety of RF circuitry. Any of the power combiners/splitters described herein can be used as a power combiner and/or as a power splitter in any of the quadrature combined Doherty amplifiers described below with respect to FIGS. 9A-13. However, the power combiners/splitters can also be used in other configurations of RF circuitry.

Examples of Quadrature Combined Doherty Amplifiers

A Doherty amplifier includes a carrier amplification stage and a peaking amplification stage for providing amplification to a radio frequency (RF) input signal. Additionally, the Doherty amplifier combines a carrier signal component from the carrier amplification stage and a peaking signal component from the peaking stage to generate an amplified output signal.

The linearity of a Doherty amplifier is based on a balance of amplitude and phase of the carrier signal component relative to the peaking signal component. When a Doherty amplifier drives a mismatched load, the linearity of the Doherty amplifier is degraded. For example, an AM-AM linearity characteristic of a Doherty amplifier with mismatched load can exhibit a step or kink having a direction that depends on a phase of mismatch. A load mismatch of a Doherty amplifier can arise from a variety of sources, including, but not limited to variation in S11 versus frequency of a transmit filter, duplexer, antenna, and/or other components that serve as a load to the Doherty amplifier.

Furthermore, the sharpness of the Doherty amplifier's gain step response under mismatch can increase with the efficiency of the Doherty amplifier. Thus, a high efficiency Doherty amplifier can suffer from excessively high adjacent channel leakage ratio (ACLR) and/or out-of-band emissions when operating with a mismatched load.

Quadrature combined Doherty amplifiers are provided herein. In certain configurations, a separator is used to separate an RF input signal into a plurality of input signal components that are amplified by a pair of Doherty amplifiers operating in quadrature. Additionally, a combiner is used to combine a plurality of output signal components generated by the pair of Doherty amplifiers, thereby generating an RF output signal exhibiting quadrature balancing.

By using a quadrature combined Doherty amplifier, flatter gain versus frequency, lower variation in saturated output power (Psat), and/or superior power-added efficiency (PAE) can be achieved. Furthermore, distortion arising from mismatch is reduced since each Doherty amplifier of the pair can be pulled in opposite directions to cause partial cancellation of intermodulation distortion (IMD) products. Moreover, a quadrature combined Doherty amplifier can include a hybrid termination resistor, which can absorb a reflected wave to thereby reduce output ripple and/or eliminate multiple reflections between the amplifier and a mismatched load.

In certain implementations, a Doherty amplifier includes a carrier amplification stage and/or a peaking amplification stage implemented using a cascode-based amplification stage. Using cascode amplification stages can realize a number of advantages, including, but not limited to, higher output impedance, proportionality of gain to load impedance, higher gain due to reduced Miller effect, and/or quasi-unilateral behavior.

Furthermore, gain modulation by varying load results in linear operation of the quadrature combined Doherty amplifier as well as reduced mismatch of the peaking amplification stages in a high power range, for instance, from 6 db back-off to saturated power. Although mismatch of the carrier amplification stages can increase, the carrier amplification stages of each Doherty amplifier of the pair are pulled in opposite directions, and thus overall distortion is reduced.

The quadrature combined Doherty amplifiers are applicable to a wide variety of RF communication systems, including, but not limited to, smartphones, laptops, handsets, wearable electronics, and/or tablets. In certain implementations, the quadrature combined Doherty amplifier serves as a power amplifier (PA) in an RF communication system. Thus, the quadrature combined Doherty amplifier can be used to generate an amplified RF output signal that is wirelessly transmitted via an antenna.

Figure 9A:
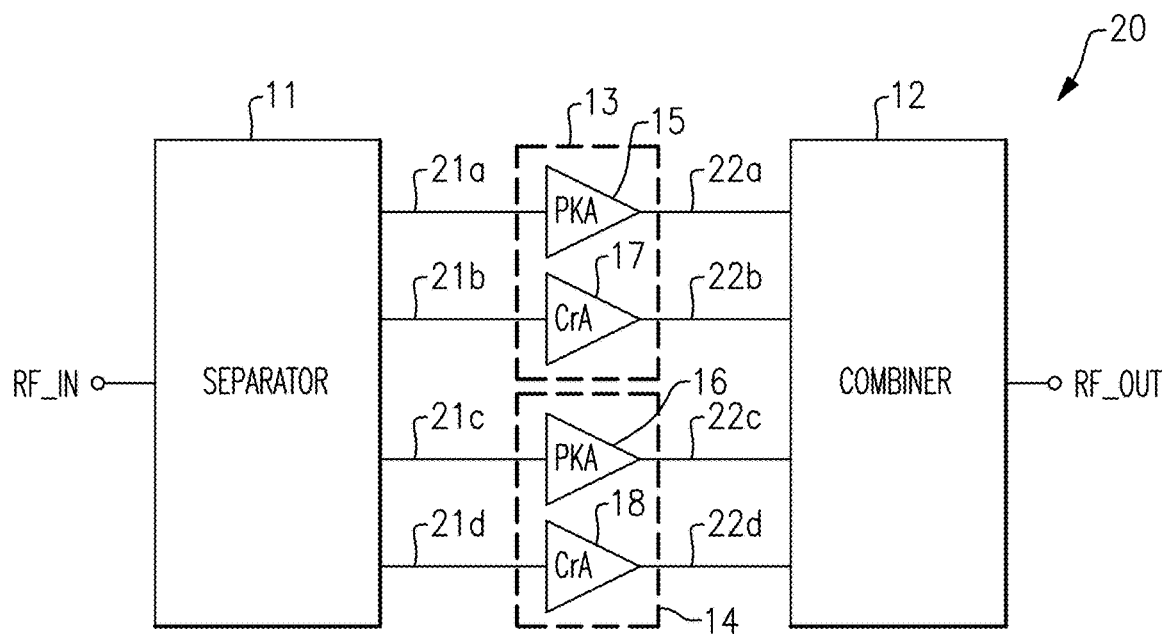
FIG. 9A is a schematic diagram of one embodiment of a quadrature combined Doherty amplifier.

FIG. 9A is a schematic diagram of one embodiment of a quadrature combined Doherty amplifier 20. The quadrature combined Doherty amplifier 20 includes a separator 11, a combiner 12, and a pair of Doherty amplifiers including a first Doherty amplifier 13 and a second Doherty amplifier 14. The first Doherty amplifier 13 includes a first peaking amplification stage 15 and a first carrier amplification stage 17. The second Doherty amplifier 14 includes a second peaking amplification stage 16 and a second carrier amplification stage 18.

As shown in FIG. 9A, the separator 11 separates the RF input signal RF_IN into a plurality of input signal components 21a-21d that are amplified by the pair of Doherty amplifiers. Additionally, the pair of Doherty amplifiers generate a plurality of output signal components 22a-22d that are combined using the combiner 12 to generate the RF output signal RF_OUT. The first Doherty amplifier 13 amplifies a first pair of the input signal components 21a, 21b and the second Doherty amplifier 14 amplifies a second pair of the input signal components 21c, 21d.

In certain implementations, the first input signal component 21a and the second input signal component 21b have a quadrature phase relationship, or a phase separation of about 90°. Additionally, the third input signal component 21c and the fourth input signal component 21d have a quadrature phase relationship. Furthermore, in certain configurations, the first input signal component 21a and the third input signal component 21c have a quadrature phase relationship, and the second input signal component 21b and the fourth input signal component 21d have a quadrature phase relationship. Thus, the input signals 21a, 21b to the first Doherty amplifier 13 can have a quadrature phase relationship to the input signals 21c, 21d to the second Doherty amplifier 14.

The quadrature combined Doherty amplifier 20 can exhibit relatively flat gain versus frequency, relatively low variation in Psat, and/or excellent PAE performance. Furthermore, distortion arising from mismatch of the amplifier's load is reduced since the first Doherty amplifier 13 and the second Doherty amplifier 14 can be pulled in opposite directions to cause partial cancellation of intermodulation distortion (IMD) products. Moreover, the combiner 12 can include a hybrid termination resistor, which can absorb a reflected wave to thereby reduce output ripple and/or eliminate multiple reflections between the amplifier 20 and a mismatched load.

Figure 9B:
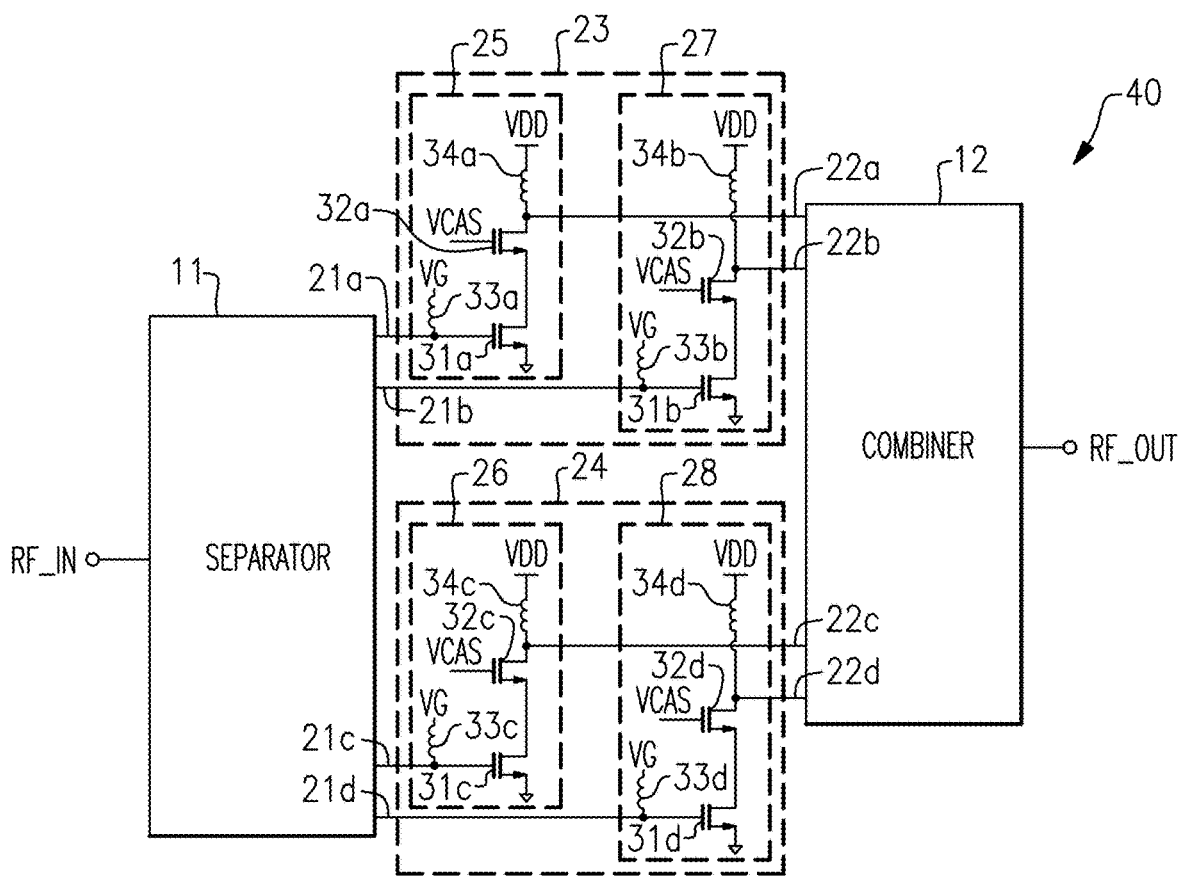
FIG. 9B is a schematic diagram of another embodiment of a quadrature combined Doherty amplifier.

FIG. 9B is a schematic diagram of another embodiment of a quadrature combined Doherty amplifier 40. The quadrature combined Doherty amplifier 40 includes a separator 11, a combiner 12, and a pair of Doherty amplifiers including a first Doherty amplifier 23 and a second Doherty amplifier 24. The first Doherty amplifier 23 includes a first cascode peaking amplification stage 25 and a first cascode carrier amplification stage 27. The second Doherty amplifier 24 includes a second cascode peaking amplification stage 26 and a second cascode carrier amplification stage 28.

The quadrature combined Doherty amplifier 40 of FIG. 9B is similar to the quadrature combined Doherty amplifier 20 of FIG. 9A, except that the quadrature combined Doherty amplifier 40 of FIG. 9B includes a specific implementation of carrier and peaking amplification stages.

In the illustrated embodiment, the Doherty amplifiers are each implemented with cascode amplification stages. For example, the first cascode peaking amplification stage 25 includes a gain transistor 31a, a cascode transistor 32a, an input biasing inductor 33a, and a DC feed inductor 34a. Additionally, the first cascode carrier amplification stage 27 includes a gain transistor 31b, a cascode transistor 32b, an input biasing inductor 33b, and a DC feed inductor 34b. Furthermore, the second cascode peaking amplification stage 26 includes a gain transistor 31c, a cascode transistor 32c, an input biasing inductor 33c, and a DC feed inductor 34c. Additionally, the second cascode carrier amplification stage 28 includes a gain transistor 31d, a cascode transistor 32d, an input biasing inductor 33d, and a DC feed inductor 34d.

As shown in FIG. 9B, the input biasing inductors 33a-33d serve to bias the gates of the gain transistors 31a-31d, respectively, with a gate bias voltage VG. Additionally, the cascode transistors 32a-32d are biased with a cascode gate voltage VCAS. Furthermore, the DC feed inductors 34a-34d serve to provide the drains of the cascode transistors 32a-32d, respectively, with a power supply voltage VDD.

Although one implementation of cascode-based amplification stages for Doherty amplifiers is shown in FIG. 9B, the teachings herein are applicable to other implementations of amplification stages for Doherty amplifiers, including, but not limited to, other configurations of cascode-based amplification stages. For example, the teachings herein are also applicable to cascode amplification stages using bipolar transistors, or a combination of field-effect transistors and bipolar transistors. Furthermore, the teachings here are applicable to different implementations of biasing.

Using cascode amplification stages in the quadrature combined Doherty amplifier 40 can realize a number of advantages, including, but not limited to, higher output impedance, proportionality of gain to load impedance, higher gain due to reduced Miller effect (presence of the cascode transistors 32a-32d reduces drain voltage variation of the gain transistors 31a-31d, and thus the gate-to-drain capacitances of transistors 31a-31d have a smaller impact on gain), and/or quasi-unilateral behavior.

Furthermore, gain modulation by varying load results in linear operation of the quadrature combined Doherty amplifier 40 as well as reduced mismatch of the cascode peaking amplification stages in a high power range, for instance, from 6 db back-off to saturated power. Although mismatch of the cascode carrier amplification stages can increase, the first cascode carrier amplification stage 27 and the second cascode carrier amplification stage 28 are pulled in opposite directions, and thus overall distortion is reduced.

Figure 9C:
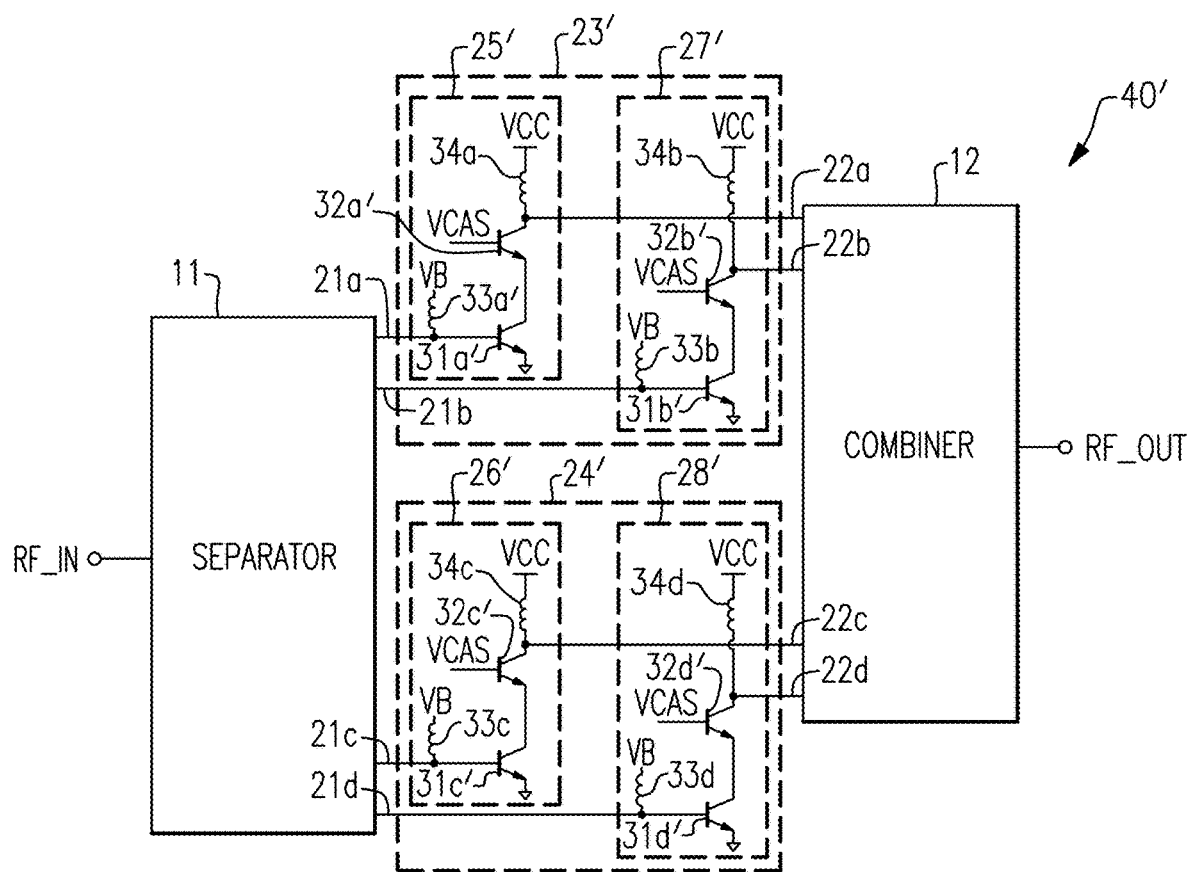
FIG. 9C is a schematic diagram of another embodiment of a quadrature combined Doherty amplifier.

FIG. 9C is a schematic diagram of another embodiment of a quadrature combined Doherty amplifier 40'. The quadrature combined Doherty amplifier 40' includes a separator 11, a combiner 12, and a pair of Doherty amplifiers including a first Doherty amplifier 23' and a second Doherty amplifier 24'. The first Doherty amplifier 23' includes a first cascode peaking amplification stage 25' and a first cascode carrier amplification stage 27'. The second Doherty amplifier 24' includes a second cascode peaking amplification stage 26' and a second cascode carrier amplification stage 28'.

The Doherty amplifier 40' of FIG. 9C is similar to the Doherty amplifier 40 of FIG. 9B, except that a bipolar transistor implementation is shown rather than a FET implementation. For example, the first cascode peaking amplification stage 25' includes a gain transistor 31a', a cascode transistor 32a', an input biasing inductor 33a, and a DC feed inductor 34a. Additionally, the first cascode carrier amplification stage 27' includes a gain transistor 31b', a cascode transistor 32b', an input biasing inductor 33b, and a DC feed inductor 34b. Furthermore, the second cascode peaking amplification stage 26' includes a gain transistor 31c', a cascode transistor 32c', an input biasing inductor 33c, and a DC feed inductor 34c. Additionally, the second cascode carrier amplification stage 28' includes a gain transistor 31d', a cascode transistor 32d', an input biasing inductor 33d, and a DC feed inductor 34d.

As shown in FIG. 9C, the input biasing inductors 33a-33d serve to bias the gates of the gain transistors 31a'-31d', respectively, with a base bias voltage VB. Additionally, the cascode transistors 32a'-32d' are biased with a cascode base voltage VCAS. Furthermore, the DC feed inductors 34a-34d serve to provide the drains of the cascode transistors 32a'-32d', respectively, with a power supply voltage VCC.

Figure 9D:
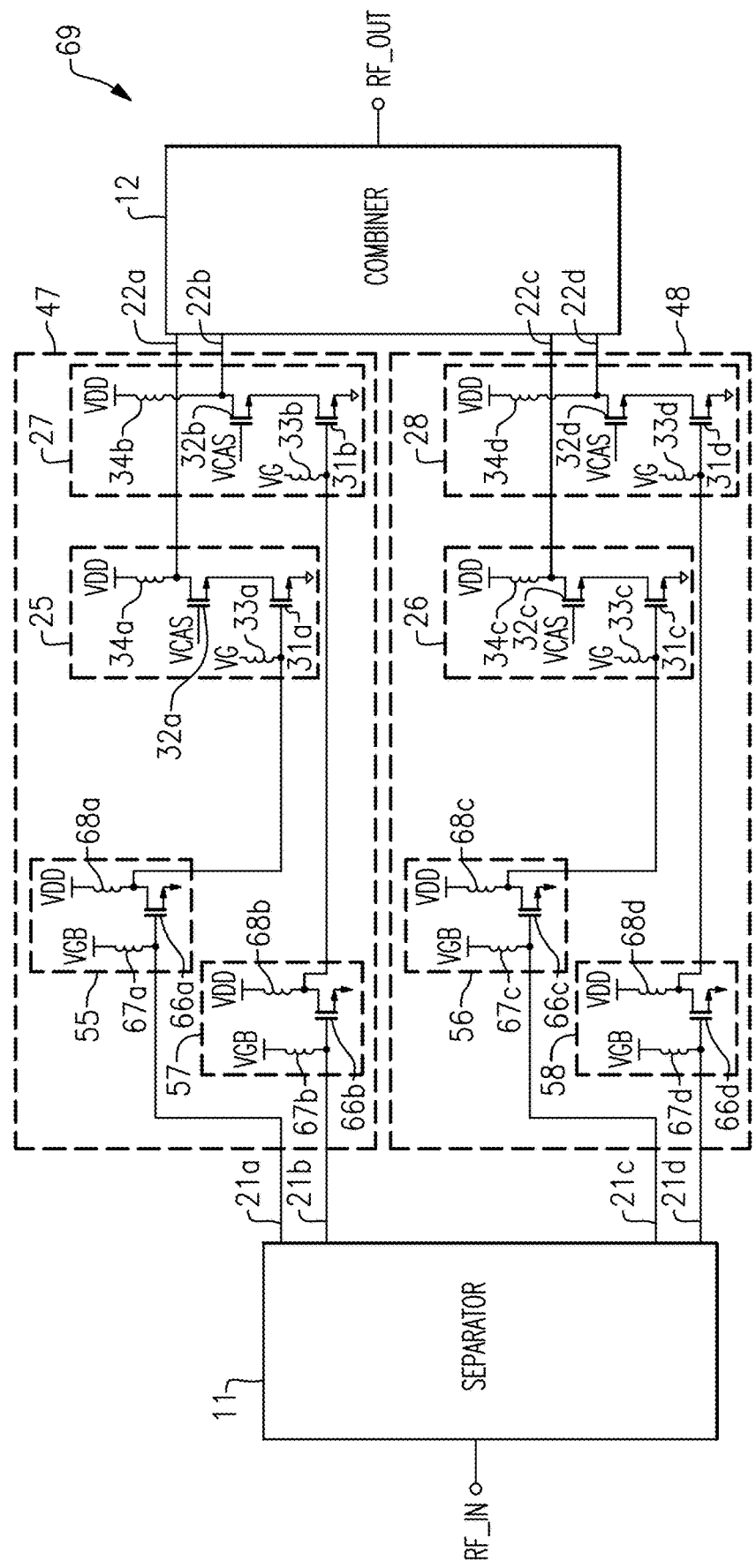
FIG. 9D is a schematic diagram of another embodiment of a quadrature combined Doherty amplifier.

FIG. 9D is a schematic diagram of another embodiment of a quadrature combined Doherty amplifier 69. The quadrature combined Doherty amplifier 69 includes a separator 11, a combiner 12, and a pair of Doherty amplifiers including a first Doherty amplifier 47 and a second Doherty amplifier 48.

As shown in FIG. 9D, the first Doherty amplifier 47 includes a first peaking input stage 55, a first cascode peaking amplification stage 25, a first carrier input stage 57, and a first cascode carrier amplification stage 27. Additionally, the second Doherty amplifier 48 includes a second peaking input stage 56, a second cascode peaking amplification stage 26, a second carrier input stage 58, and a second cascode carrier amplification stage 28.

The quadrature combined Doherty amplifier 69 of FIG. 9D is similar to the quadrature combined Doherty amplifier 40 of FIG. 9B, except that the quadrature combined Doherty amplifier 69 of FIG. 9D further includes the first peaking input stage 55, the second peaking input stage 56, the first carrier input stage 57, and the second carrier input stage 58.

In certain embodiments herein, multi-stage peaking amplifiers and multi-stage carrier amplifiers are used in a quadrature combined Doherty amplifier. Although one such embodiment is depicted in FIG. 9D, other implementations are possible.

In the illustrated embodiment, the first peaking input stage 55 includes a gain transistor 66a, an input biasing inductor 67a, and a DC feed inductor 68a. Additionally, the first carrier input stage 57 includes a gain transistor 66b, an input biasing inductor 67b, and a DC feed inductor 68b. Furthermore, the second peaking input stage 56 includes a gain transistor 66c, an input biasing inductor 67c, and a DC feed inductor 68c. Additionally, the second carrier input stage 58 includes a gain transistor 66d, an input biasing inductor 67d, and a DC feed inductor 68d.

As shown in FIG. 9D, the input biasing inductors 67a-67d serve to bias the gates of the gain transistors 66a-66d, respectively, with a gate bias voltage VGB. Additionally, the DC feed inductors 68a-68d serve to provide the drains of the gain transistors 66a-66d, respectively, with the power supply voltage VDD.

Figure 10:
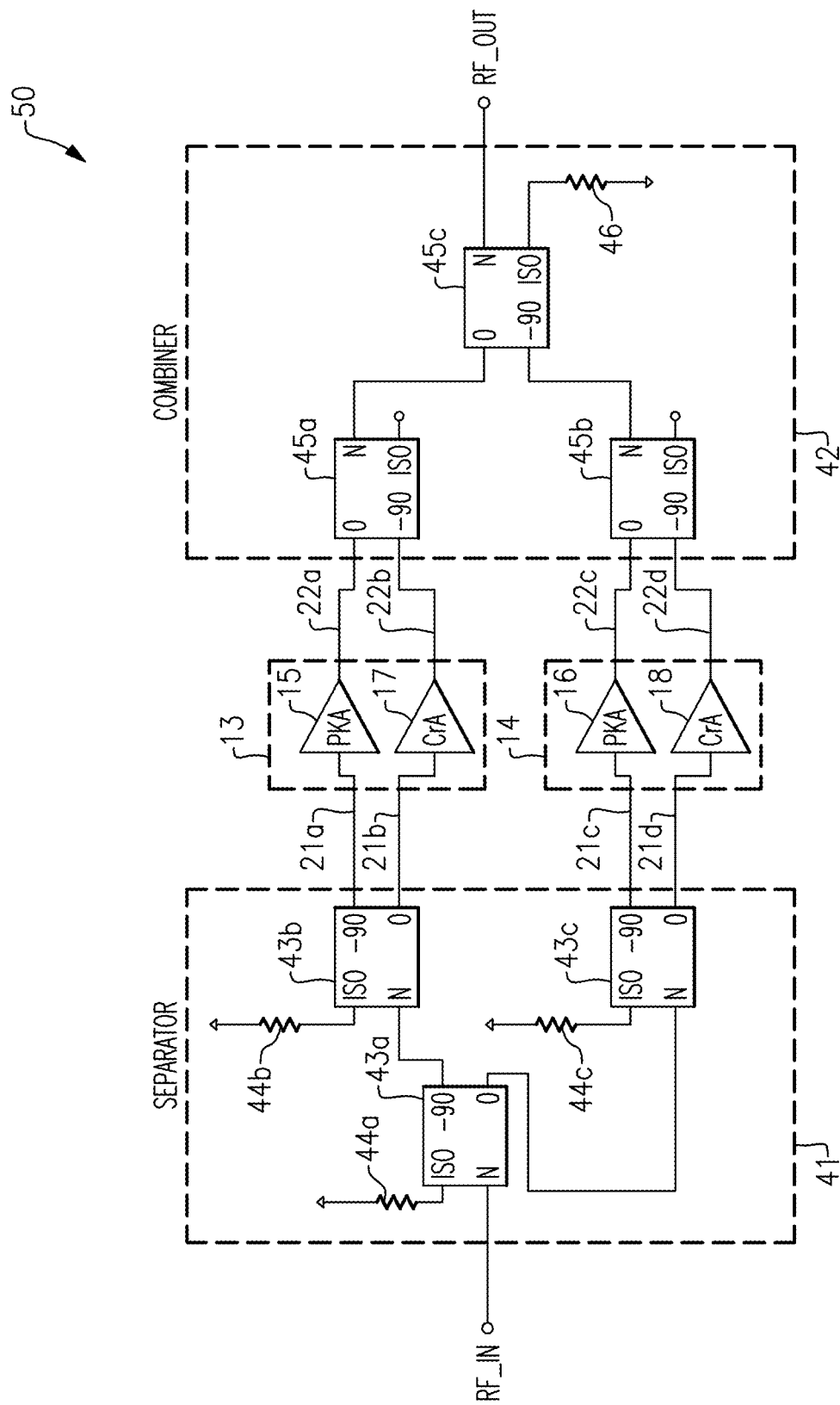
FIG. 10 is a schematic diagram of another embodiment of a quadrature combined Doherty amplifier.

FIG. 10 is a schematic diagram of another embodiment of a quadrature combined Doherty amplifier 50. The quadrature combined Doherty amplifier 50 includes a separator 41, a combiner 42, and a pair of Doherty amplifiers including a first Doherty amplifier 13 and a second Doherty amplifier 14.

The quadrature combined Doherty amplifier 50 of FIG. 10 is similar to the quadrature combined Doherty amplifier 20 of FIG. 9A, except that the quadrature combined Doherty amplifier 50 of FIG. 10 includes specific implementations of a separator and a combiner. The separator 41 of FIG. 10 illustrates one implementation of the separator 21 of FIG. 9A. Additionally, the combiner 42 of FIG. 10 illustrates one implementation of the combiner 22 of FIG. 9A.

As shown in FIG. 10, the separator 41 includes a first power divider or splitter 43a, a second power splitter 43b, a third power splitter 43c, a first termination resistor 44a, a second terminal resistor 44b, and a third termination resistor 44c. In certain implementations, each of the termination resistors 44a-44c has a resistance of about 50Ω.

In the illustrated embodiment, each power splitter includes an input port (N), an isolation port (ISO), a thru port (0), and a coupling port (−90). As persons having ordinary skill in the art with appreciate, a power splitter can be used to process an input signal to generate output signal components of about equal power and about a 90° phase difference.

In the illustrated embodiment, the first input signal component 21a has about a −180° phase, the second input signal component 21b has about a −90° phase, the third input signal component 21c has about a −90° phase, and the fourth input signal component 21d has about a 0° phase. However, other implementations are possible.

With continuing reference to FIG. 10, the combiner 50 includes a first power combiner 45a, a second power combiner 45b, a third power combiner 45c, and a hybrid termination resistor 46. The power combiners 45a-45c have similar ports or terminals as the power splitters 43a-43c, but operate in a reversed configuration to provide power combining rather than power splitting. In certain implementations, the hybrid termination resistor 46 has a resistance of about 50Ω.

Figure 11:
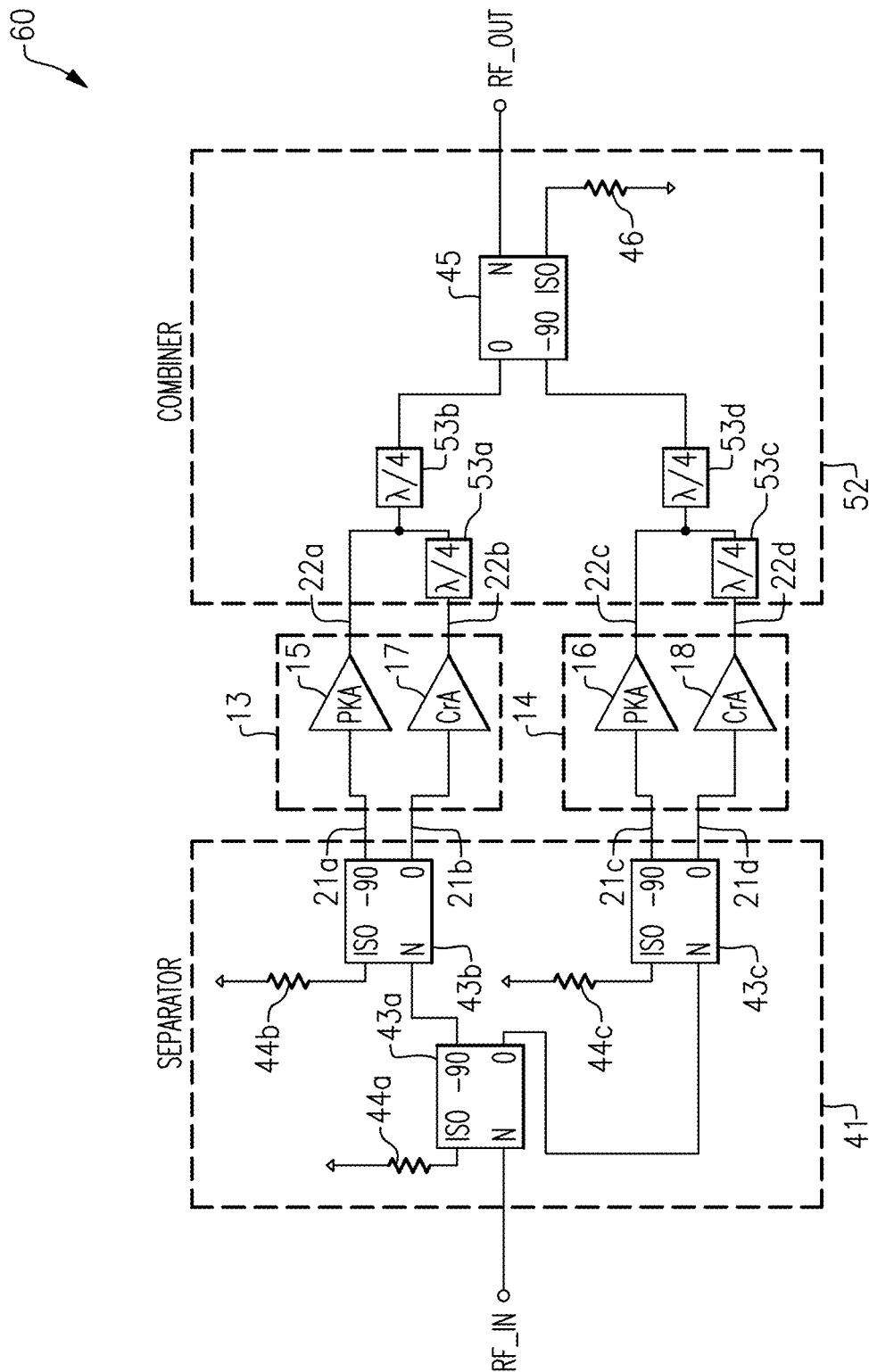
FIG. 11 is a schematic diagram of another embodiment of a quadrature combined Doherty amplifier.

FIG. 11 is a schematic diagram of another embodiment of a quadrature combined Doherty amplifier 60. The quadrature combined Doherty amplifier 60 includes a separator 41, a combiner 52, and a pair of Doherty amplifiers including a first Doherty amplifier 13 and a second Doherty amplifier 14.

The quadrature combined Doherty amplifier 60 of FIG. 11 is similar to the quadrature combined Doherty amplifier 50 of FIG. 10, except that the quadrature combined Doherty amplifier 60 of FIG. 11 includes a different implementation of a combiner 52.

As shown in FIG. 11, the combiner 52 includes a power combiner 45, a hybrid termination resistor 46, a first quarter wavelength ($\lambda/4$) transmission line section 53a, a second quarter wavelength transmission line section 53b, a third quarter wavelength transmission line section 53c, and a fourth quarter wavelength transmission line section 53d. Each of the quarter wavelength transmission line sections 53a-53d provides a phase delay of about 90°, and thus serves as a transmission line impedance inverter.

The quarter wavelength transmission line sections 53a-53d can be implemented in a wide variety of ways, including, but not limited to using lumped pi ($\pi$) and/or lumped tee (T) sections.

Figure 12:
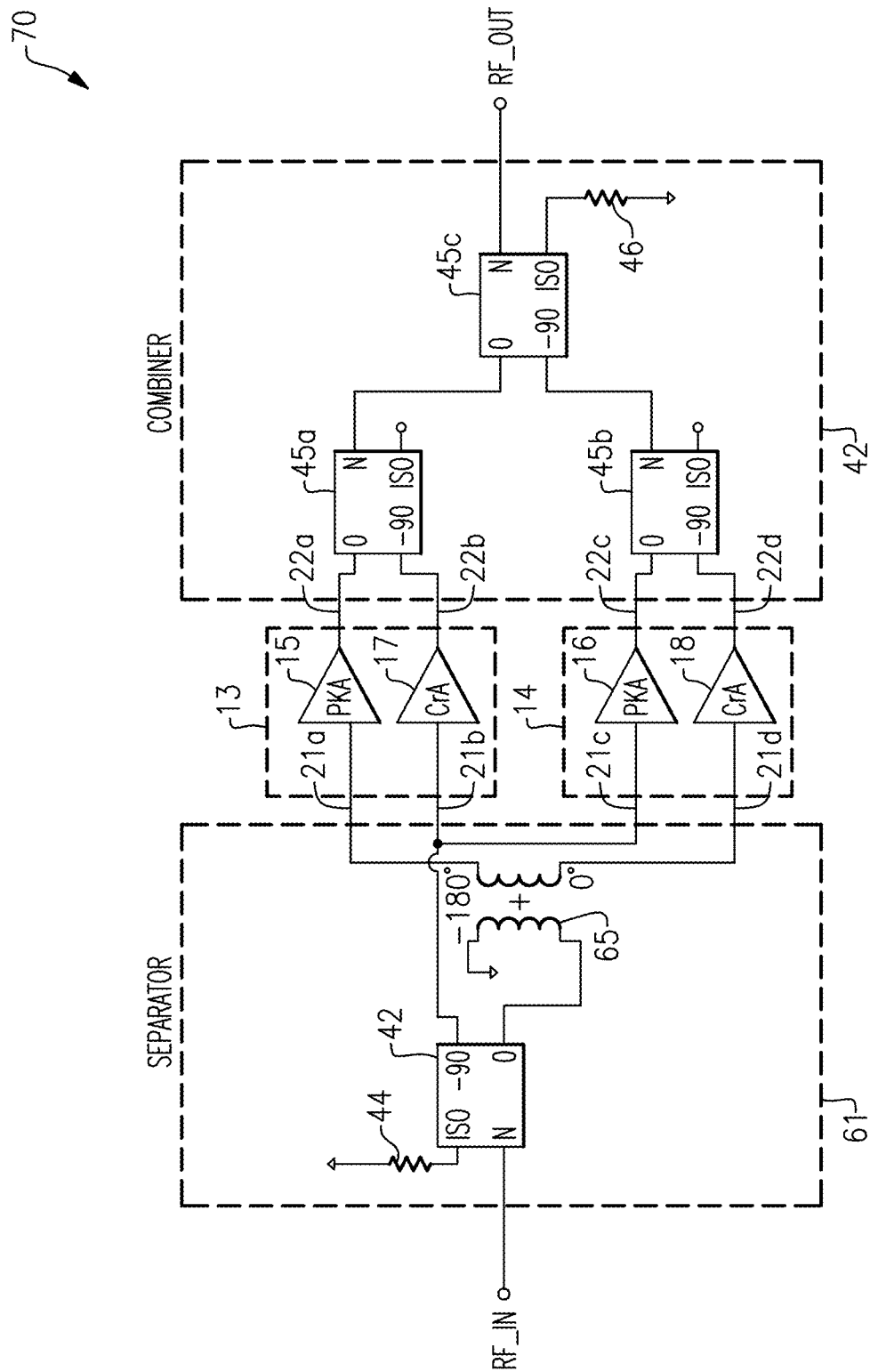
FIG. 12 is a schematic diagram of another embodiment of a quadrature combined Doherty amplifier.

FIG. 12 is a schematic diagram of another embodiment of a quadrature combined Doherty amplifier 70. The quadrature combined Doherty amplifier 70 includes a separator 61, a combiner 42, and a pair of Doherty amplifiers including a first Doherty amplifier 13 and a second Doherty amplifier 14.

The quadrature combined Doherty amplifier 70 of FIG. 12 is similar to the quadrature combined Doherty amplifier 50 of FIG. 10, except that the quadrature combined Doherty amplifier 70 of FIG. 12 includes a different implementation of a separator 61.

As shown in FIG. 12, the separator 61 includes a power splitter 42, a termination resistor 44, and a balun 65.

In certain implementations, the individual core amplifier inputs of the first Doherty amplifier 13 and the second Doherty amplifier 14 are matched to 2*Zo (for instance, 100Ω), where Zo is the system impedance (for instance, 50Ω) of the combined quadrature Doherty amplifier.

Figure 13:
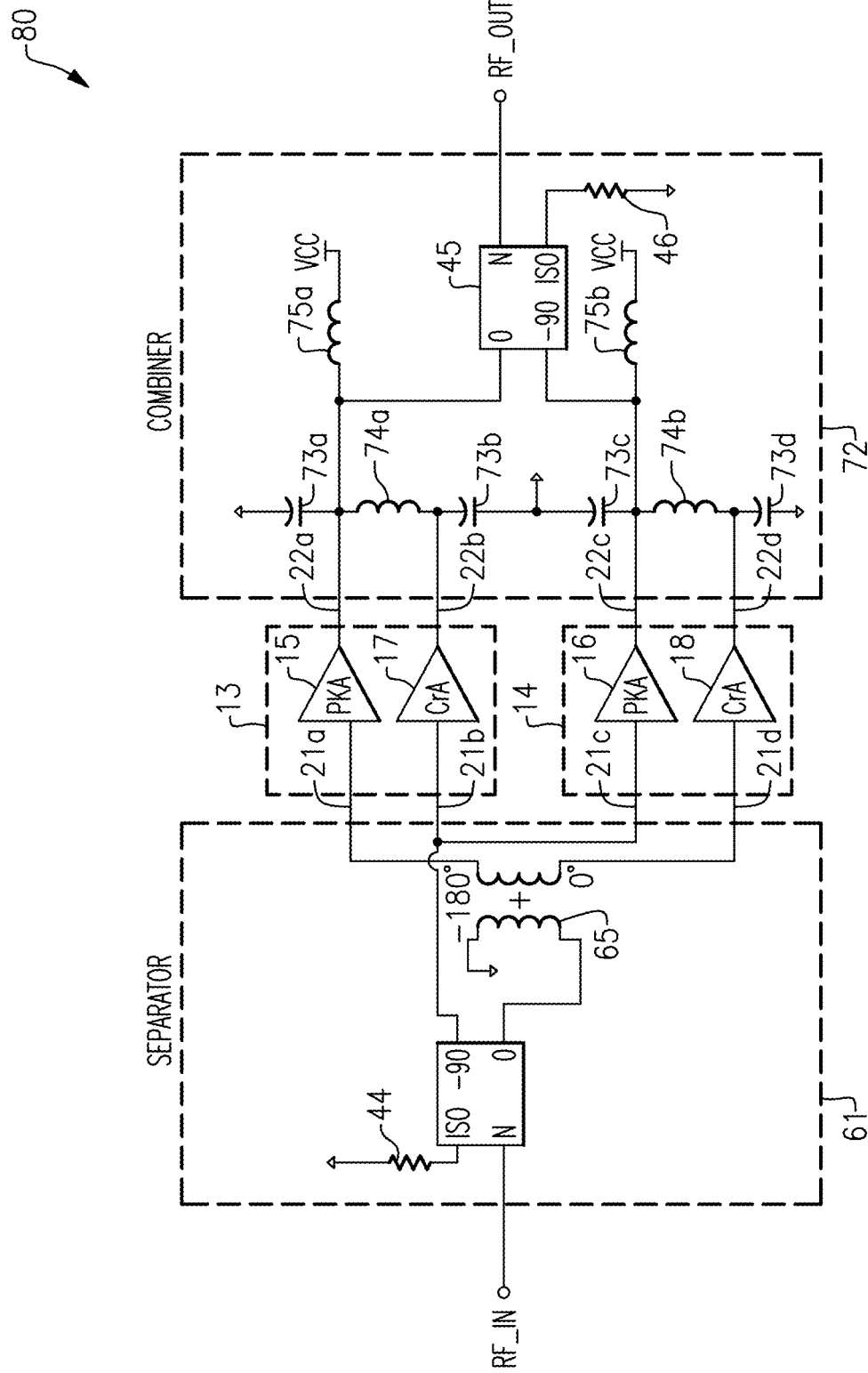
FIG. 13 is a schematic diagram of another embodiment of a quadrature combined Doherty amplifier.

FIG. 13 is a schematic diagram of another embodiment of a quadrature combined Doherty amplifier 80. The quadrature combined Doherty amplifier 80 includes a separator 61, a combiner 72, and a pair of Doherty amplifiers including a first Doherty amplifier 13 and a second Doherty amplifier 14.

The quadrature combined Doherty amplifier 80 of FIG. 13 is similar to the quadrature combined Doherty amplifier 70 of FIG. 12, except that the quadrature combined Doherty amplifier 80 of FIG. 13 includes a different implementation of a combiner 72.

As shown in FIG. 13, the combiner 72 includes a power combiner 45, a hybrid termination resistor 46, a first combiner capacitor 73a, a second combiner capacitor 73b, a third combiner capacitor 73c, a fourth combiner capacitor 73d, a first combiner inductor 74a, a second combiner inductor 74b, a first DC feed inductor 75a, and a second DC feed inductor 75b.

Using passive components to provide power combining can provide a relatively compact layout, thereby aiding in integration of the combiner 72. For example, the simplified semi-lumped implementation of FIG. 13 can be suitable for applications associated with relaxed output power and conducted harmonics specifications.

In certain implementations, both the inputs and outputs of the first Doherty amplifier 13 and the second Doherty amplifier 14 are matched to 2*Zo (for instance, 100Ω), where Zo is the system impedance (for instance, 50Ω) of the combined quadrature Doherty amplifier.

Examples of Simulation Results

FIGS. 14A-14D illustrate one example of simulation results for a combiner/splitter. The simulation results correspond to plots obtained by simulating one implementation of the combiner/splitter of FIG. 3.

Figure 14A:
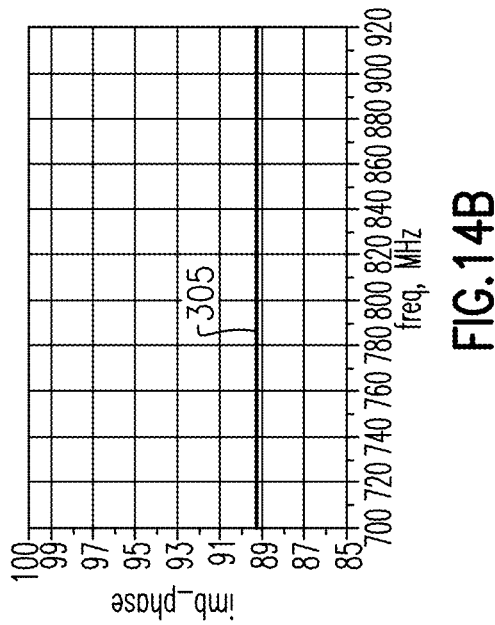
FIG. 14A illustrates a plot of amplitude imbalance versus frequency for one example of a combiner/splitter.

FIG. 14A illustrates one example of a plot 301 of amplitude imbalance (in dB) versus frequency.

Figure 14B:
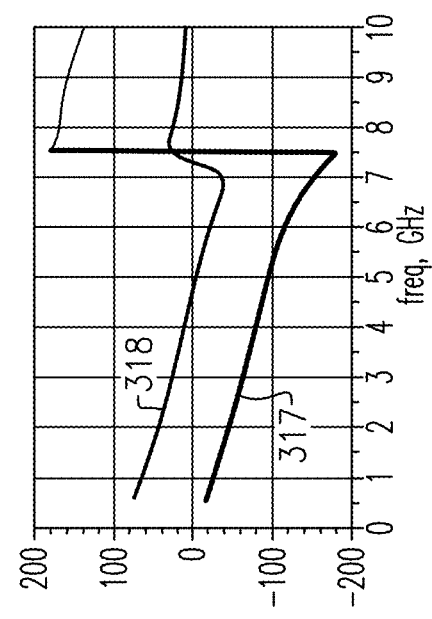
FIG. 14B illustrates a plot of phase imbalance versus frequency for one example of a combiner/splitter.

FIG. 14B illustrates one example of a plot 302 of phase imbalance (in degrees) versus frequency.

Figure 14C:
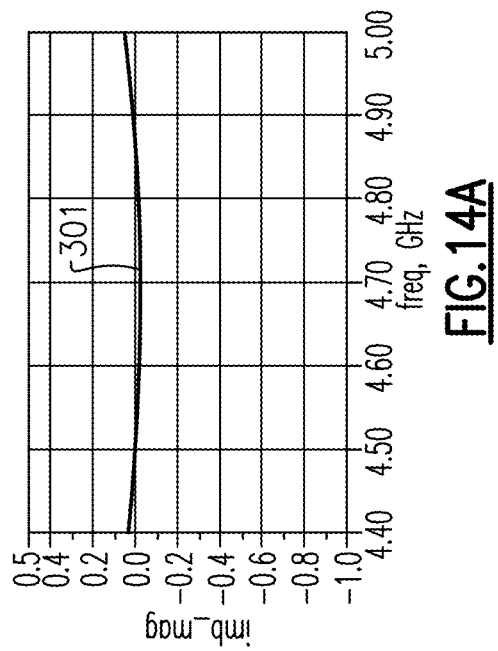
FIG. 14C illustrates a plot of S-parameters in decibels versus frequency for one example of a combiner/splitter.

FIG. 14C illustrates one example of S-parameters (in dB) versus frequency. The graph includes a first plot 311 corresponding to S-parameter dB(1,1), a second plot 312 of corresponding to S-parameter dB(1,2), a third plot 313 corresponding to S-parameter dB(1,3), and a fourth plot 314 corresponding to S-parameter dB(1,4), where the first port (1) is the input port, the second port (2) is the thru port, port three (3) is the isolation port, and port four (4) is the coupling port.

Figure 14D:
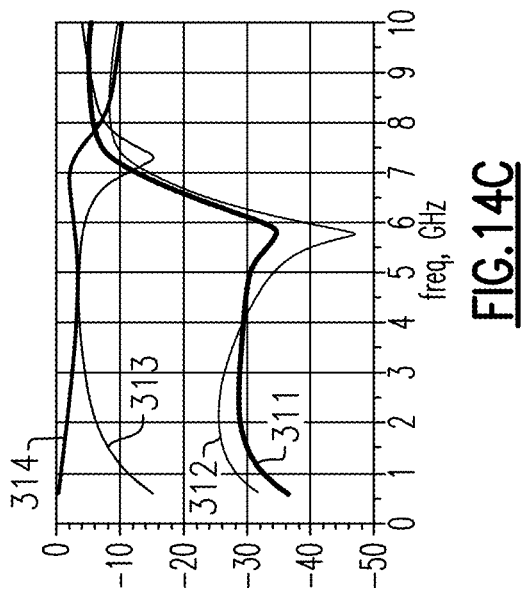
FIG. 14D illustrates a plot of S-parameters in degrees versus frequency for one example of a combiner/splitter.

FIG. 14D illustrates one example of S-parameters (in degrees) versus frequency. The graph includes a first plot 317 corresponding to S-parameter phase(1,2) and a second plot 318 of S-parameter phase(1,3).

FIGS. 15A-15F illustrate one example of simulation results for a combiner/splitter. The simulation results correspond to plots obtained by simulating one implementation of the combiner/splitter of FIG. 4. FIGS. 15A-15D correspond to simulated results for an implementation using an integrated passive devices (IPD) die, while FIGS. 15E-15F correspond to correspond to simulated results for an implementation using a laminate.

Figure 15A:
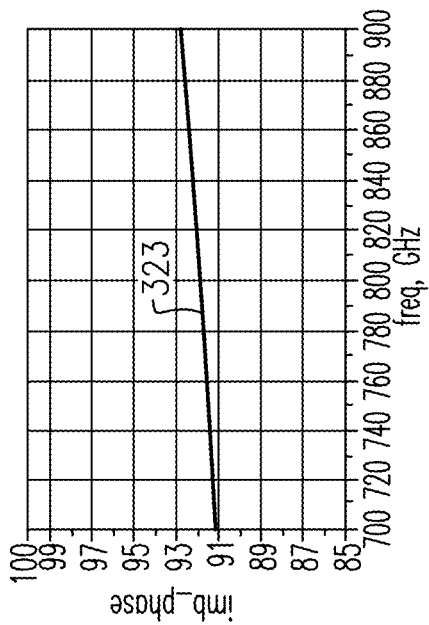
FIG. 15A illustrates a plot of amplitude imbalance versus frequency for another example of a combiner/splitter.

FIG. 15A illustrates one example of a plot 321 of amplitude imbalance (in dB) versus frequency. As shown in FIG. 15A the simulated geometry exhibits a +/−0.15 dB magnitude imbalance over a 200 MHz range of frequency.

Figure 15B:
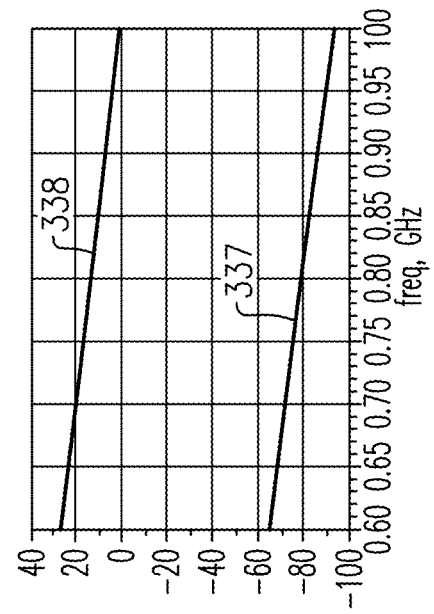
FIG. 15B illustrates a plot of phase imbalance versus frequency for another example of a combiner/splitter.

FIG. 15B illustrates one example of a plot 322 of phase imbalance (in degrees) versus frequency.

Figure 15C:
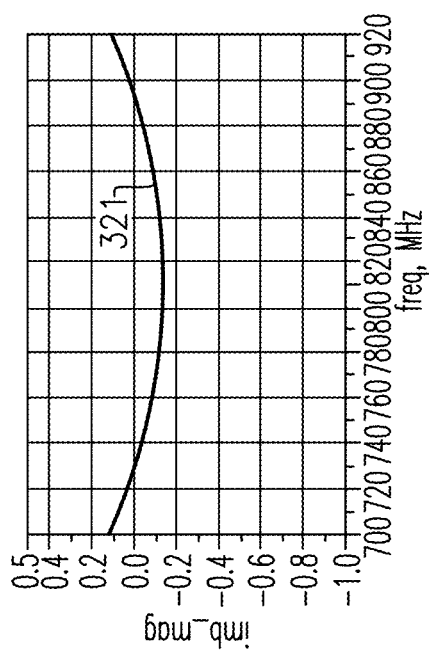
FIG. 15C illustrates a plot of S-parameters in decibels versus frequency for another example of a combiner/splitter.

FIG. 15C illustrates one example of S-parameters (in dB) versus frequency. The graph includes a first plot 331 corresponding to S-parameter dB(1,1), a second plot 332 of corresponding to S-parameter dB(1,2), a third plot 333 corresponding to S-parameter dB(1,3), and a fourth plot 334 corresponding to S-parameter dB(1,4), where the first port (1) is the input port, the second port (2) is the thru port, port three (3) is the isolation port, and port four (4) is the coupling port.

Figure 15D:
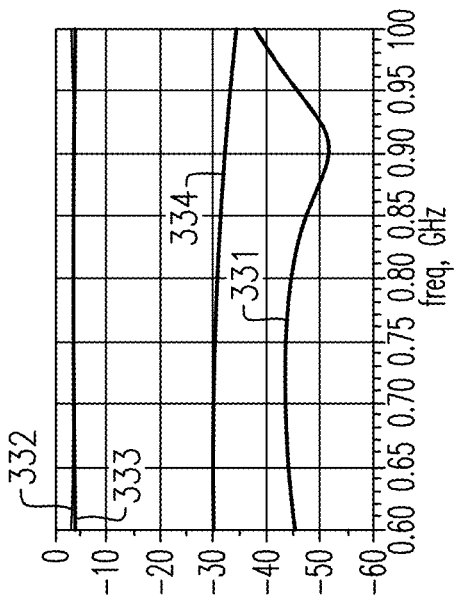
FIG. 15D illustrates a plot of S-parameters in degrees versus frequency for another example of a combiner/splitter.

FIG. 15D illustrates one example of S-parameters (in degrees) versus frequency. The graph includes a first plot 337 corresponding to S-parameter phase(1,2) and a second plot 338 of S-parameter phase(1,3).

Figure 15F:
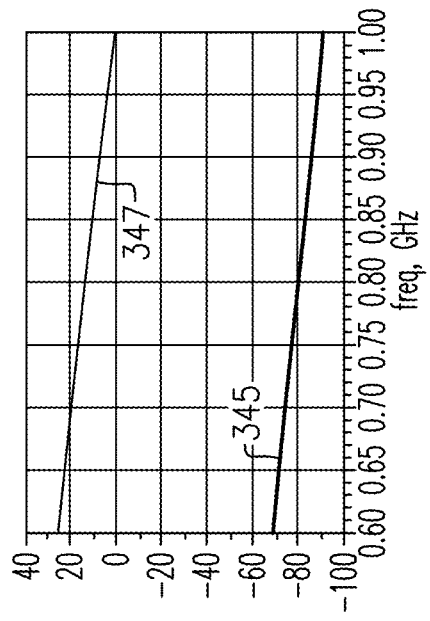
FIG. 15F illustrates a plot of S-parameters in degrees versus frequency for another example of a combiner/splitter.
Figure 15E:
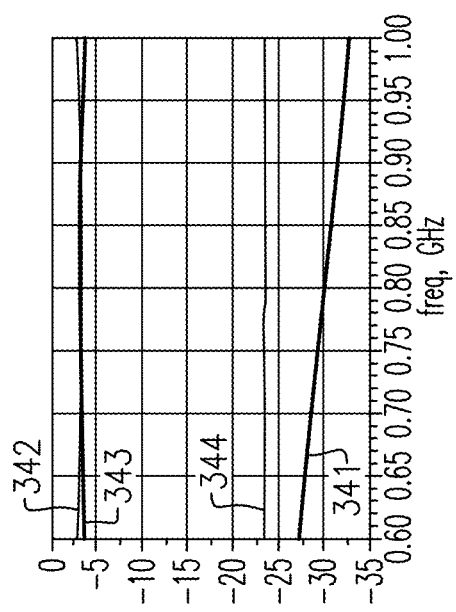
FIG. 15E illustrates a plot of S-parameters in decibels versus frequency for another example of a combiner/splitter.

FIG. 15E illustrates one example of S-parameters (in dB) versus frequency. The graph includes a first plot 341 corresponding to S-parameter dB(1,1), a second plot 342 of corresponding to S-parameter dB(1,2), a third plot 343 corresponding to S-parameter dB(1,3), and a fourth plot 344 corresponding to S-parameter dB(1,4), where the first port (1) is the input port, the second port (2) is the thru port, port three (3) is the isolation port, and port four (4) is the coupling port.

FIG. 15F illustrates one example of S-parameters (in degrees) versus frequency. The graph includes a first plot 347 corresponding to S-parameter phase(1,2) and a second plot 348 of S-parameter phase(1,3).

Figure 16:
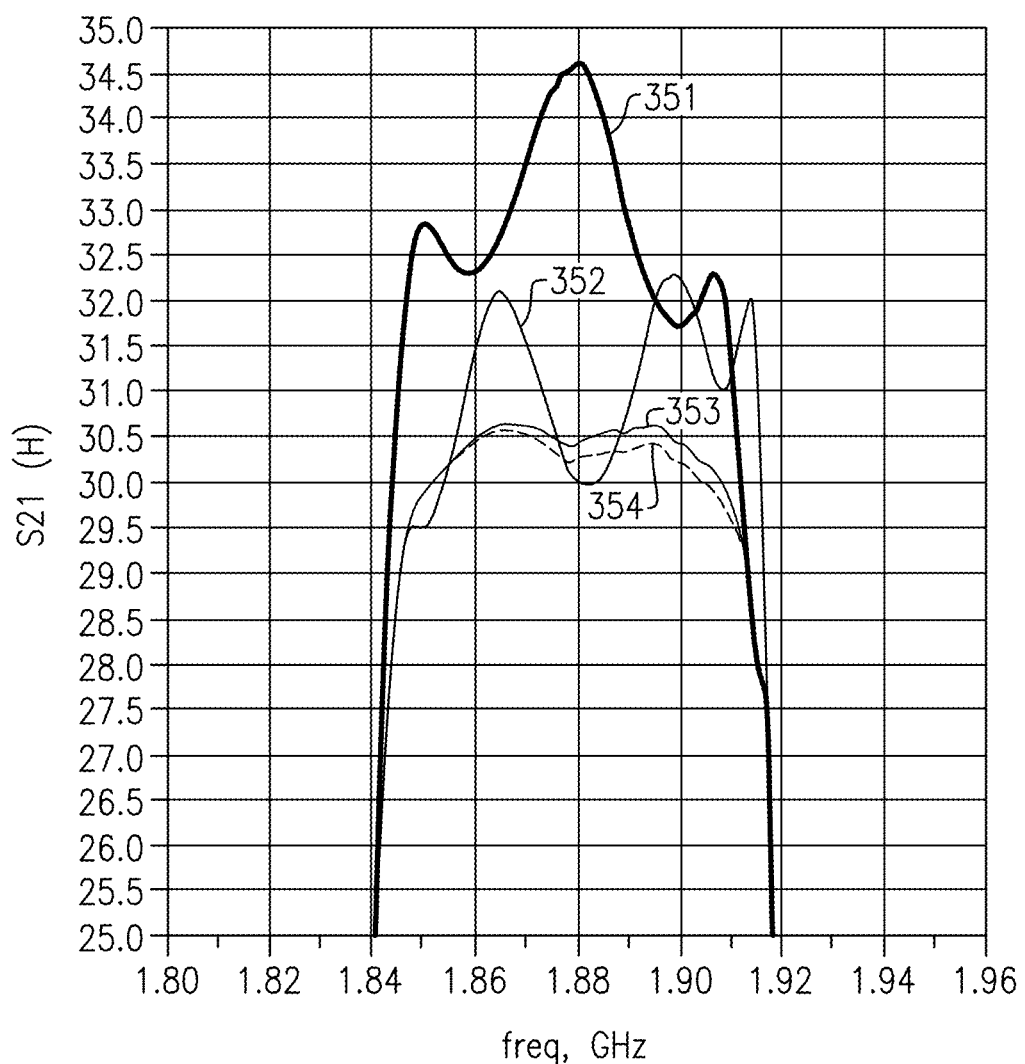
FIG. 16 illustrates one example of simulation results of S21 versus frequency for various amplifiers.

FIG. 16 illustrates one example of simulation results of S21 versus frequency for various amplifiers. The graph includes a first plot 351 of S21 versus frequency for a single-ended amplifier, a second plot 352 of S21 versus frequency for a Doherty amplifier, a third plot 353 of S21 versus frequency for a quadrature combined Doherty amplifier, and a fourth plot 354 of load S21 (normalized).

As shown in FIG. 16, the quadrature combined Doherty amplifier provides reduced S21 variation versus frequency, and thus advantageously provides a reduction in gain ripple.

Figure 17:
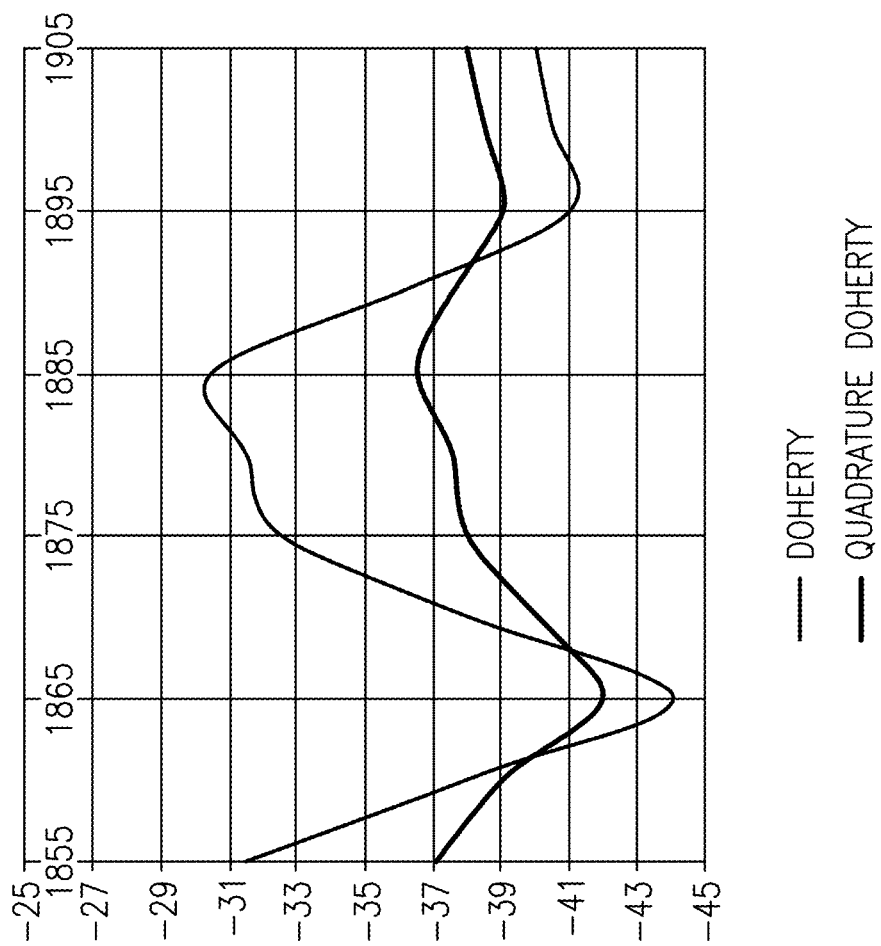
FIG. 17 illustrates one example of simulation results of adjacent channel leakage ratio (ACLR) versus frequency for a Doherty amplifier and for a quadrature combined Doherty amplifier.

FIG. 17 illustrates one example of simulation results of adjacent channel leakage ratio (ACLR) versus frequency for a Doherty amplifier and for a quadrature combined Doherty amplifier. The simulation results are measured with a typical transmit filter.

As shown in FIG. 17, the quadrature combined Doherty amplifier exhibits less variation in ACLR versus frequency, and thus exhibits less variation in emissions levels across changes in frequency.

Figure 18:
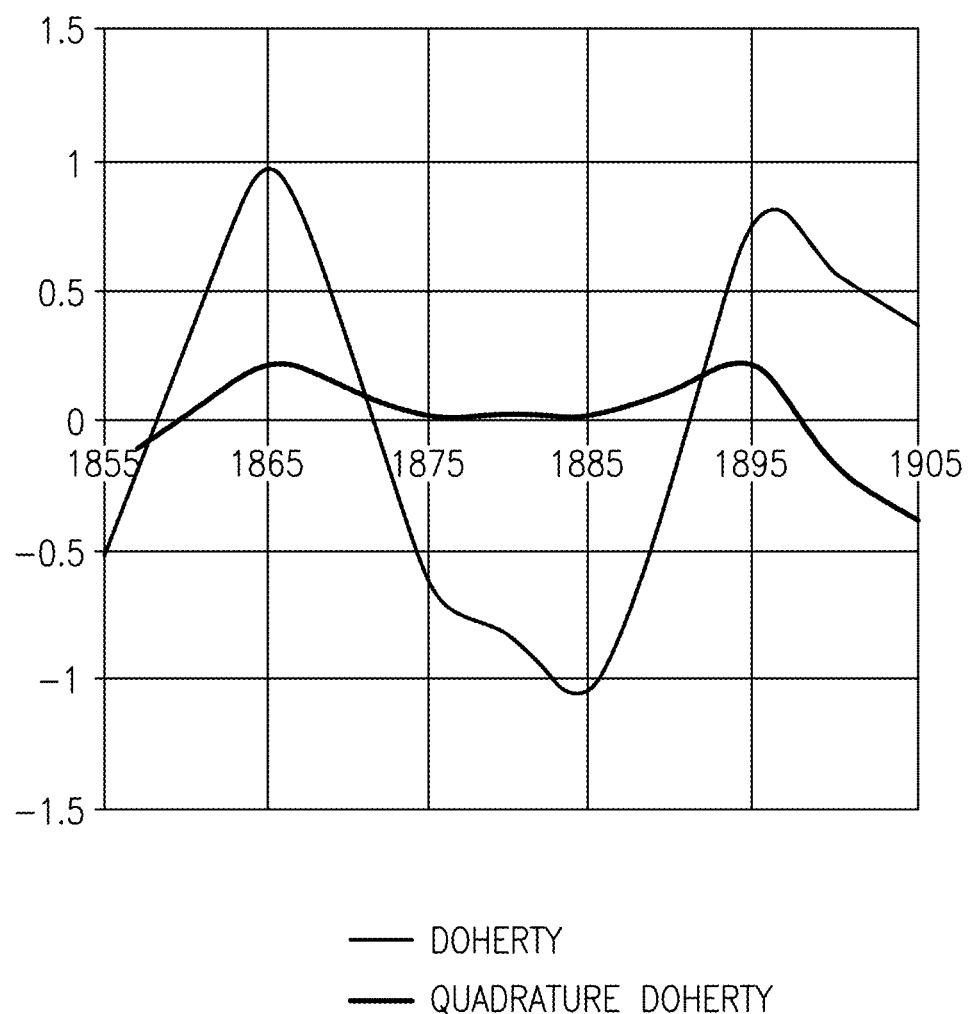
FIG. 18 illustrates one example of simulation results of saturated output power (Psat) versus frequency for a Doherty amplifier and for a quadrature combined Doherty amplifier.

FIG. 18 illustrates one example of simulation results of saturated output power (Psat) versus frequency for a Doherty amplifier and for a quadrature combined Doherty amplifier.

The simulation results are measured with a typical transmit filter. Additionally, the results are normalized. As shown in FIG. 18, the quadrature combined Doherty amplifier exhibits less variation in Psat versus frequency.

Figure 19:
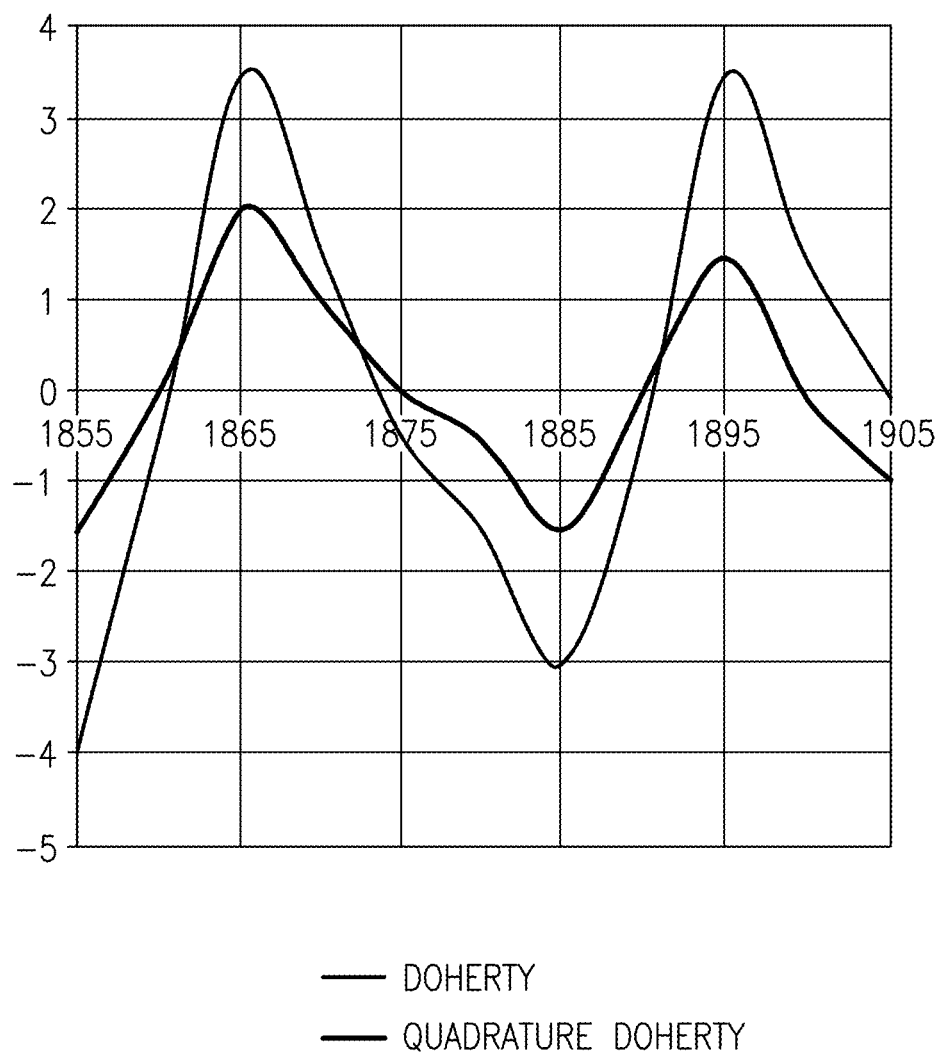
FIG. 19 illustrates one example of simulation results of power-added efficiency (PAE) versus frequency for a Doherty amplifier and for a quadrature combined Doherty amplifier.

FIG. 19 illustrates one example of simulation results of power-added efficiency (PAE) versus frequency for a Doherty amplifier and for a quadrature combined Doherty amplifier.

The simulation results are measured with a typical transmit filter. Additionally, the results are normalized. As shown in FIG. 19, the quadrature combined Doherty amplifier exhibits less variation in PAE versus frequency.

Figure 20:
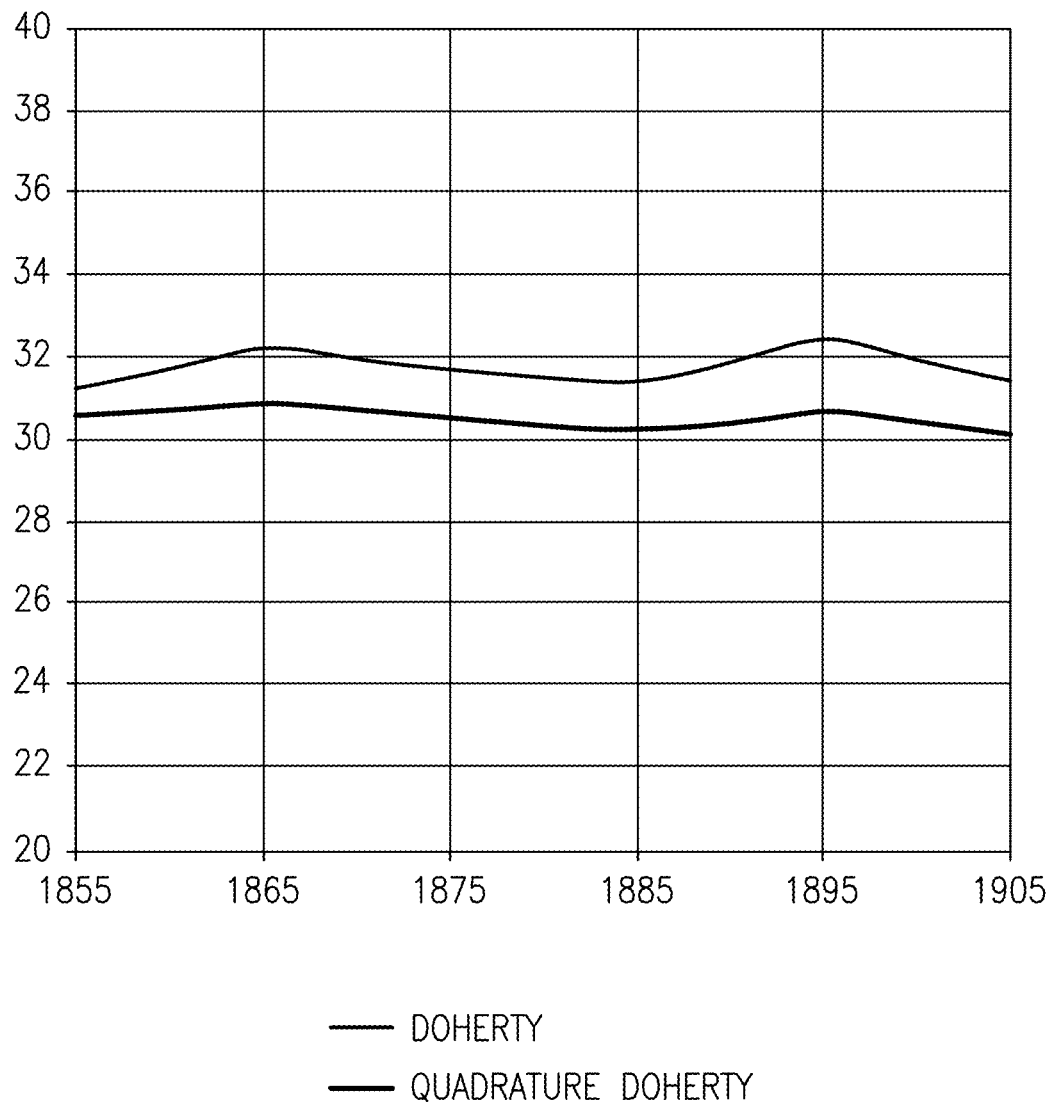
FIG. 20 illustrates one example of simulation results of gain versus frequency for a Doherty amplifier and for a quadrature combined Doherty amplifier.

FIG. 20 illustrates one example of simulation results of gain versus frequency for a Doherty amplifier and for a quadrature combined Doherty amplifier.

The simulation results are measured with a typical transmit filter. Additionally, the results are normalized. As shown in FIG. 20, the quadrature combined Doherty amplifier exhibits less variation in PAE versus frequency.

FIGS. 21A-21F illustrate one example of simulation results for a quadrature combined Doherty amplifier. The simulation results correspond to plots obtained by simulating one implementation of a quadrature combined Doherty amplifier using common source amplification stages to implement the peaking and carrier amplifiers.

Figures 21A, 21B, 21C:
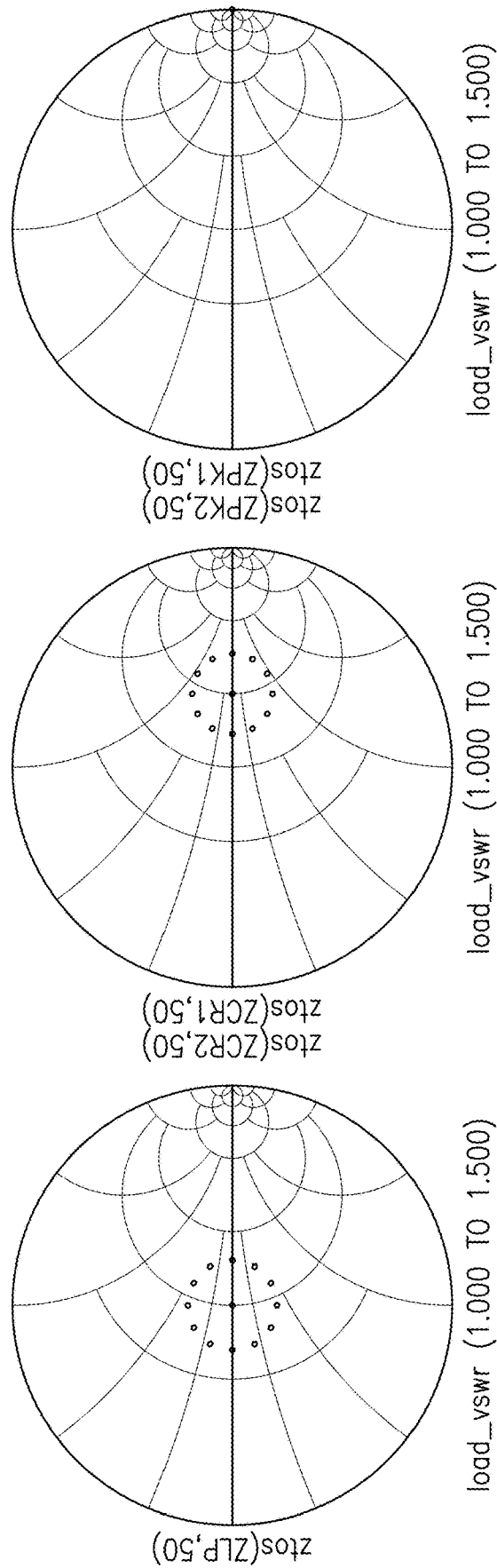
FIG. 21A illustrates a Smith chart of load impedance versus voltage standing wave ratio (VSWR) for one example of a quadrature combined Doherty amplifier in a low power mode.
FIG. 21B illustrates a Smith chart of impedance seen by the carrier amplifiers versus VSWR for one example of a quadrature combined Doherty amplifier in a low power mode.
FIG. 21C illustrates a Smith chart of impedance seen by the peaking amplifiers versus VSWR for one example of a quadrature combined Doherty amplifier in a low power mode.

The simulation results include Smith charts depicting various impedance trajectories when varying the load VSWR between 1 and 1.5. FIGS. 21A-21C correspond to simulations of the quadrature combined Doherty amplifier in a low power mode below the 6 dB back off point. Additionally, FIGS. 21D-21F correspond to simulations of the quadrature combined Doherty amplifier in a high power mode between the 6 dB back off point and Psat.

FIG. 21A illustrates a Smith chart of load impedance versus VSWR in the low power mode.

FIG. 21B illustrates a Smith chart of impedance seen by the carrier amplifiers versus VSWR in the low power mode.

FIG. 21C illustrates a Smith chart of impedance seen by the peaking amplifiers versus VSWR in the low power mode.

Figures 21D, 21E, 21F:
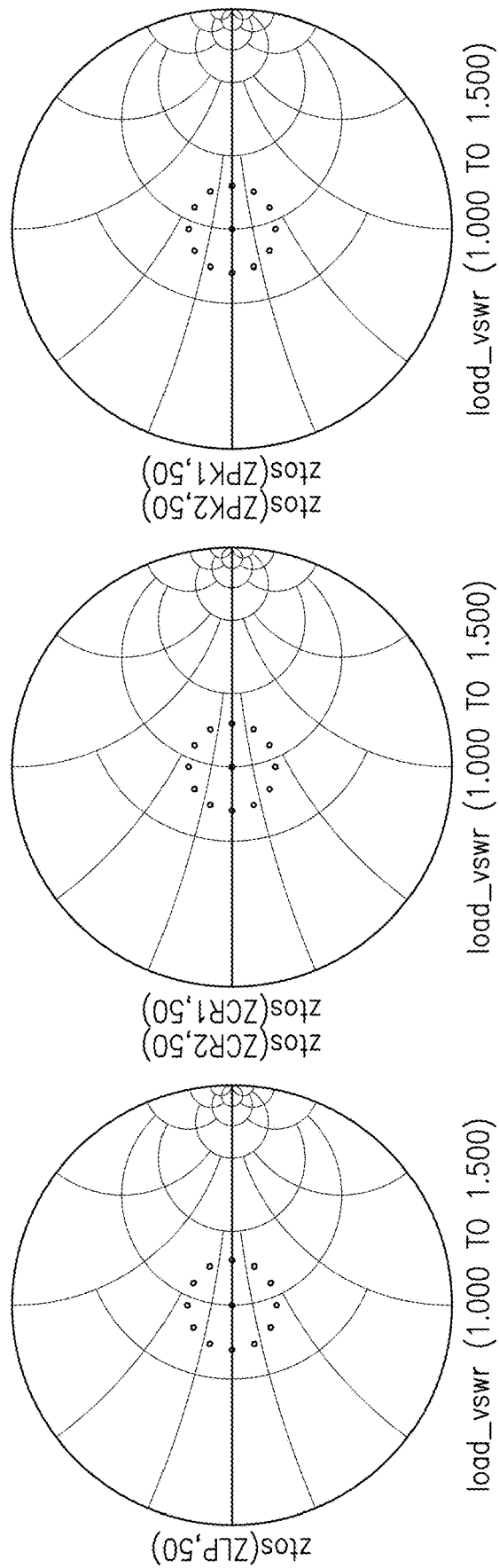
FIG. 21D illustrates a Smith chart of load impedance versus VSWR for one example of a quadrature combined Doherty amplifier in a high power mode.
FIG. 21E illustrates a Smith chart of impedance seen by the carrier amplifiers versus VSWR for one example of a quadrature combined Doherty amplifier in a high power mode.
FIG. 21F illustrates a Smith chart of impedance seen by the peaking amplifiers versus VSWR for one example of a quadrature combined Doherty amplifier in a high power mode.

FIG. 21D illustrates a Smith chart of load impedance versus VSWR in the high power mode.

FIG. 21E illustrates a Smith chart of impedance seen by the carrier amplifiers versus VSWR in the high power mode.

FIG. 21F illustrates a Smith chart of impedance seen by the peaking amplifiers versus VSWR in the high power mode.

FIGS. 22A-22F illustrate another example of simulation results for a quadrature combined Doherty amplifier. The simulation results correspond to plots obtained by simulating one implementation of a quadrature combined Doherty amplifier using cascode amplification stages to implement the peaking and carrier amplifiers.

Thus, in contrast to the simulation results of FIGS. 21A-21F which correspond to a quadrature combined Doherty amplifier implemented using common source amplification stages, the simulation results of FIGS. 22A-22F correspond to a quadrature combined Doherty amplifier implemented using cascode stages.

Figures 22A, 22B, 22C:
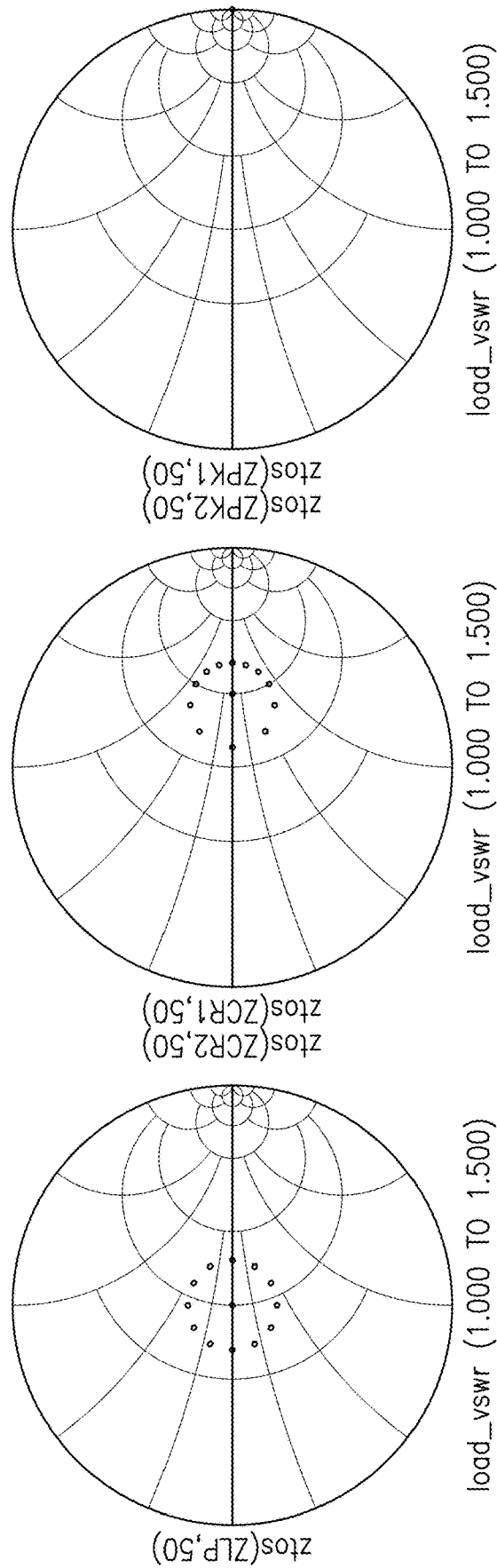
FIG. 22A illustrates a Smith chart of load impedance VSWR for another example of a quadrature combined Doherty amplifier in a low power mode.
FIG. 22B illustrates a Smith chart of impedance seen by the carrier amplifiers versus VSWR for another example of a quadrature combined Doherty amplifier in a low power mode.
FIG. 22C illustrates a Smith chart of impedance seen by the peaking amplifiers versus VSWR for another example of a quadrature combined Doherty amplifier in a low power mode.

FIG. 22A illustrates a Smith chart of load impedance VSWR in the low power mode.

FIG. 22B illustrates a Smith chart of impedance seen by the carrier amplifiers versus VSWR in the low power mode.

FIG. 22C illustrates a Smith chart of impedance seen by the peaking amplifiers versus VSWR in the low power mode.

FIG. 22D illustrates a Smith chart of load impedance versus VSWR in the high power mode.

FIG. 22E illustrates a Smith chart of impedance seen by the carrier amplifiers versus VSWR in the high power mode.

FIG. 22F illustrates a Smith chart of impedance seen by the peaking amplifiers versus VSWR in the high power mode.

As shown by a comparison of FIGS. 21A-21F to FIGS. 22A-22F, using cascode stages reduces the load pull seen by the peaking amplifier stages.

For example, when using common source stages, the same level of mismatch is exhibited as the output of the whole quadrature combined Doherty amplifier. In contrast, when using cascode stages, mismatch seen by the peaking stages is reduced, for instance, close to VSWR 1:1 regardless of load mismatch. Although carrier stages see enlarged mismatch when cascode stages are used, the pull is in opposite directions such that overall distortion is reduced.

Although various simulation results have been depicted in FIGS. 14A-22F, persons having ordinary skill in the art will appreciate that simulation results can vary for a wide variety of reasons, including, but not limited to, design implementation and/or simulation tools, models and parameters. Furthermore, although the simulations are depicted for various frequency ranges and bands, the combiners/splitters herein can operate over a wide range of frequencies and bands. Accordingly, other simulation results are possible.

Figure 23:
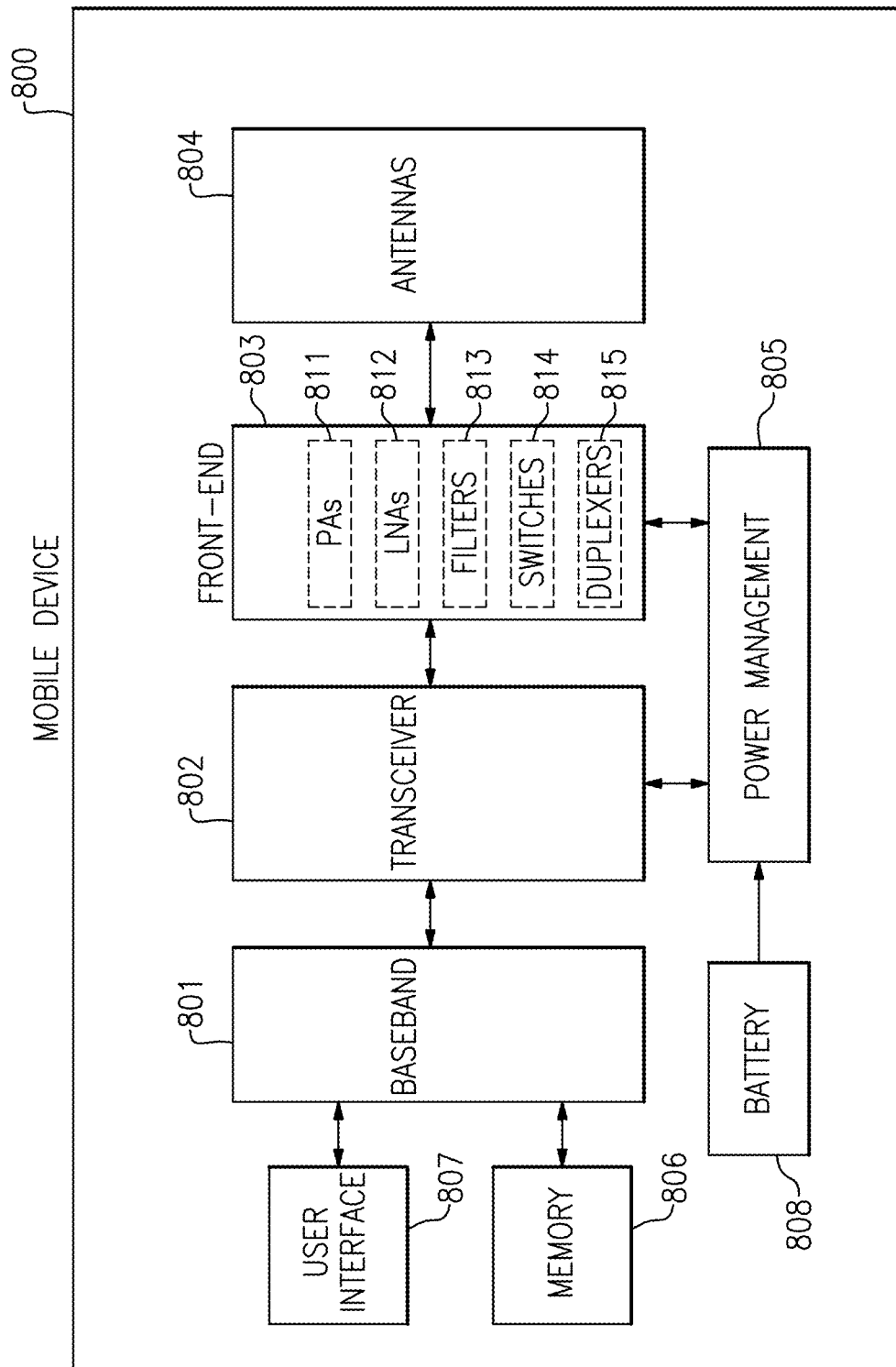
FIG. 23 is a schematic diagram of one embodiment of a mobile device.

Examples of RF Systems Including Combiners/Splitters and/or Quadrature Combined Doherty Amplifiers FIG. 23 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 illustrates one example of an RF system that can include a power combiner/splitter and/or a quadrature combined Doherty amplifier implemented in accordance with the teachings herein. For example, the front end system 803 can include one or more power combiners, power splitters, and/or Quadrature combined Doherty amplifiers implemented in accordance with the teachings herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 23 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 23, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 23, the power management system 805 receives a battery voltage from the battery 808. The battery 808 can be any suitable battery for use in the mobile device 800, including, for example, a lithium-ion battery.

Figure 24:
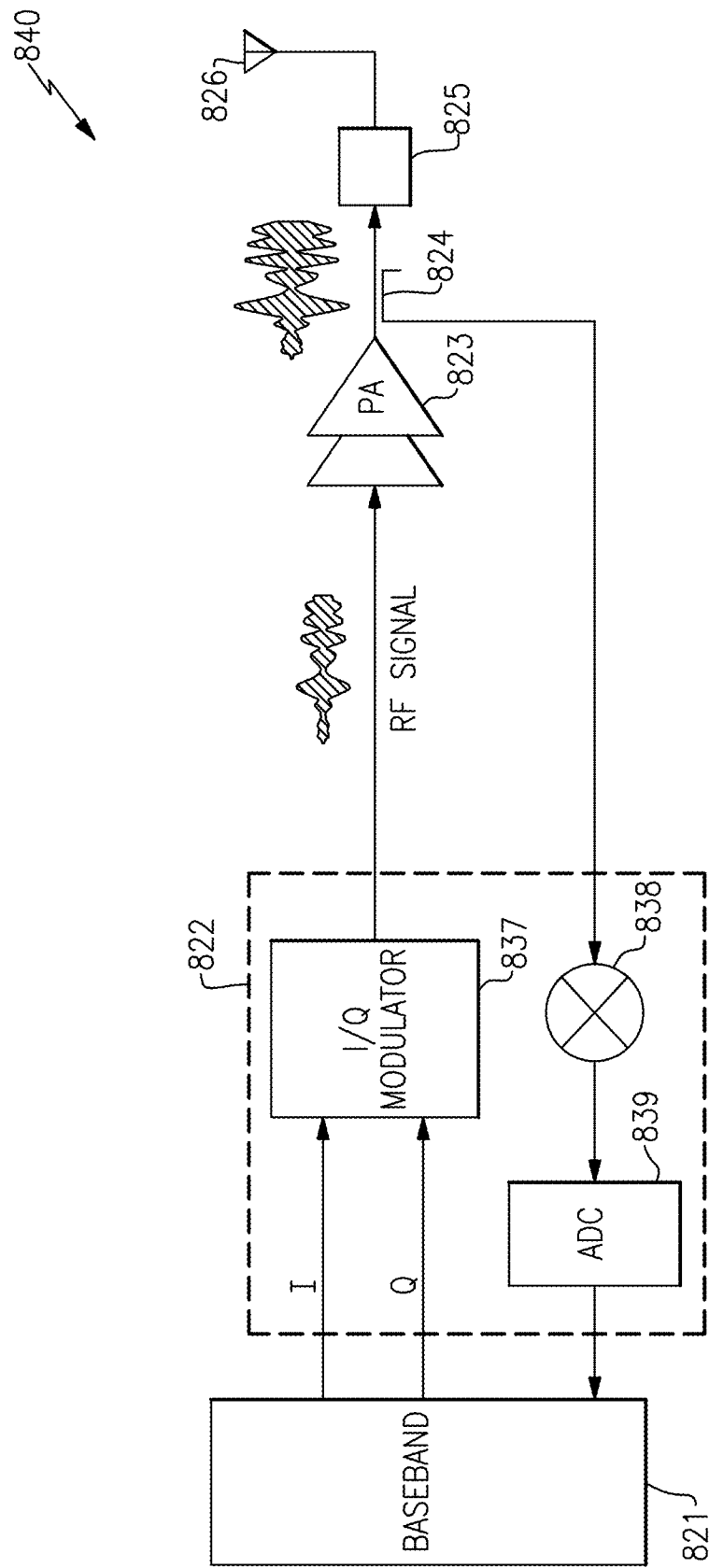
FIG. 24 is a schematic diagram of a power amplifier system according to one embodiment.

FIG. 24 is a schematic diagram of a power amplifier system 840 according to one embodiment. The illustrated power amplifier system 840 includes a baseband processor 821, a transmitter 822, a power amplifier (PA) 823, a directional coupler 824, front-end circuitry 825, and an antenna 826. The illustrated transmitter 822 includes an I/Q modulator 837, a mixer 838, and an analog-to-digital converter (ADC) 839. In certain implementations, the transmitter 822 is included in a transceiver such that both transmit and receive functionality is provided.

The power amplifier system 840 illustrates one example of an RF system that can include a combiner/splitter and/or a quadrature combined Doherty amplifier implemented in accordance with the teachings herein. For example, the power amplifier system 840 (for instance, the power amplifier 823) can include one or more power combiners, power splitters, and/or Quadrature combined Doherty amplifiers implemented in accordance with the teachings herein.

The baseband processor 821 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 837 in a digital format. The baseband processor 821 can be any suitable processor configured to process a baseband signal. For instance, the baseband processor 821 can include a digital signal processor, a microprocessor, a programmable core, or any combination thereof. Moreover, in some implementations, two or more baseband processors 821 can be included in the power amplifier system 840.

The I/Q modulator 837 can be configured to receive the I and Q signals from the baseband processor 821 and to process the I and Q signals to generate an RF signal. For example, the I/Q modulator 837 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 823. In certain implementations, the I/Q modulator 837 can include one or more filters configured to filter frequency content of signals processed therein.

The power amplifier 823 can receive the RF signal from the I/Q modulator 837, and when enabled can provide an amplified RF signal to the antenna 826 via the front-end circuitry 825.

The front-end circuitry 825 can be implemented in a wide variety of ways. In one example, the front-end circuitry 825 includes one or more switches, filters, duplexers, multiplexers, and/or other components. In another example, the front-end circuitry 825 is omitted in favor of the power amplifier 823 providing the amplified RF signal directly to the antenna 826.

The directional coupler 824 senses an output signal of the power amplifier 823. Additionally, the sensed output signal from the directional coupler 824 is provided to the mixer 838, which multiplies the sensed output signal by a reference signal of a controlled frequency. The mixer 838 operates to generate a downshifted signal by downshifting the sensed output signal's frequency content. The downshifted signal can be provided to the ADC 839, which can convert the downshifted signal to a digital format suitable for processing by the baseband processor 821. Including a feedback path from the output of the power amplifier 823 to the baseband processor 821 can provide a number of advantages. For example, implementing the baseband processor 821 in this manner can aid in providing power control, compensating for transmitter impairments, and/or in performing digital pre-distortion (DPD). Although one example of a sensing path for a power amplifier is shown, other implementations are possible.

Figure 25A:
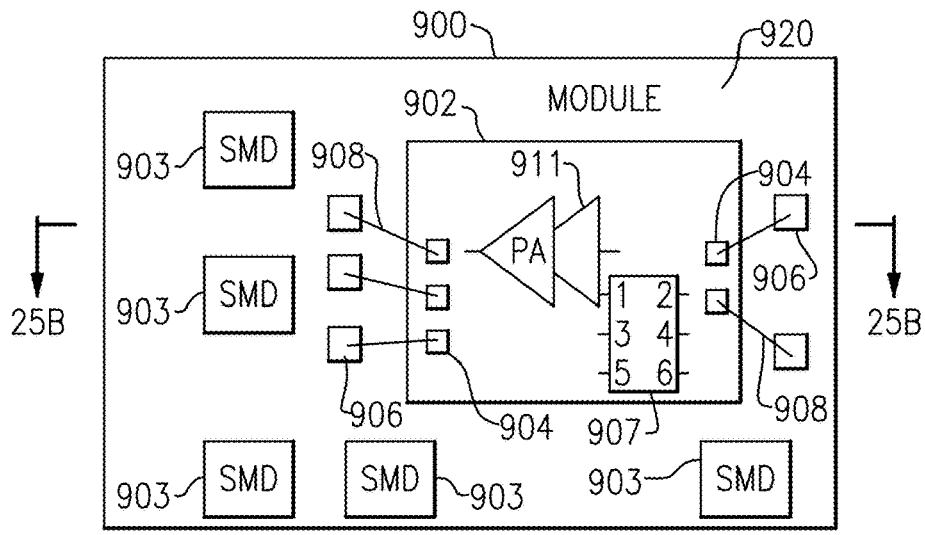
FIG. 25A is a schematic diagram of one embodiment of a packaged module.
Figure 25B:
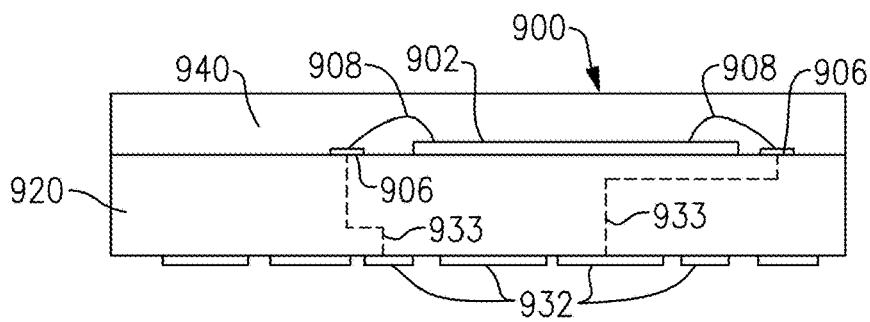
FIG. 25B is a schematic diagram of a cross-section of the packaged module of FIG. 25A taken along the lines 25B-25B.

FIG. 25A is a schematic diagram of one embodiment of a packaged module 900. FIG. 25B is a schematic diagram of a cross-section of the packaged module 900 of FIG. 25A taken along the lines 25B-25B.

The packaged module 900 includes a semiconductor die 902, surface mount devices (SMDs) 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes at least one of a power amplifier 911 or a power splitter/combiner 907. The power amplifier 911 and/or the power splitter/combiner 907 can be implemented in accordance with any of the embodiments herein. For example, the power amplifier 911 can be implemented in accordance with one or more features of FIGS. 9A-13. Additionally or alternatively, the power splitter/combiner 907 can be implemented in accordance with one or more features of FIGS. 2-8.

The packaging substrate 920 can be configured to receive a plurality of components such as the semiconductor die 902 and the surface mount devices 903, which can include, for example, surface mount capacitors and/or inductors.

As shown in FIG. 25B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a wireless device. The example contact pads 932 can be configured to provide radio frequency signals, bias signals, and/or power (for example, a power supply voltage and ground) to the semiconductor die 902 and/or the surface mount devices 903.

As shown in FIG. 25B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Figure 26:
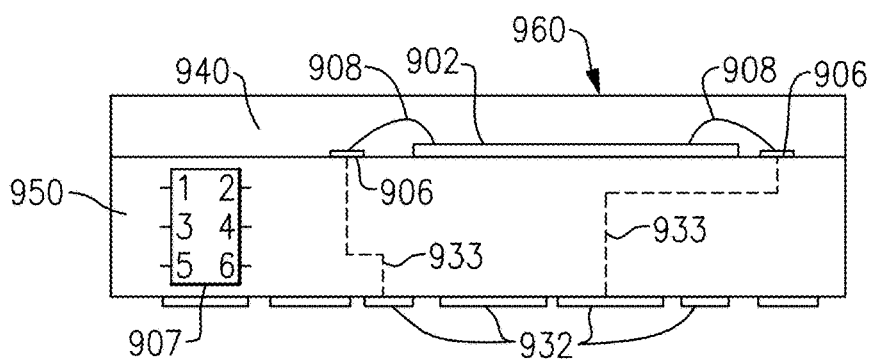
FIG. 26 is a schematic diagram of a cross-section of another embodiment of a packaged module

FIG. 26 is a schematic diagram of a cross-section of another embodiment of a packaged module 960. The packaged module 960 of FIG. 26 is similar to the packaged module 900 of FIG. 25A-25B, except that the packaged module 960 includes a packaging substrate 950 used to implement the power splitter/combiner 907. For example, the power splitter/combiner 907 can include a pair of coils formed using adjacent conductive layers of the packaging substrate 950.

Figure 27:
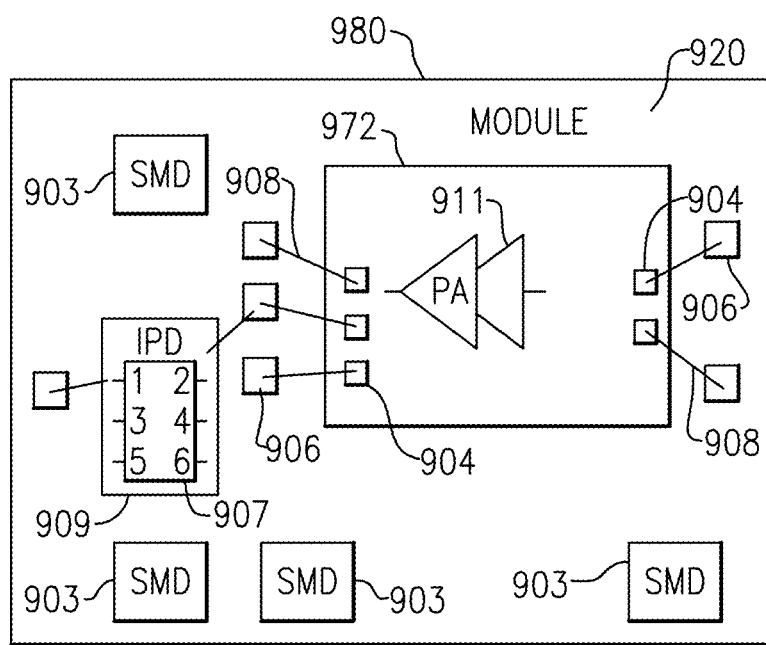
FIG. 27 is a schematic diagram of another embodiment of a packaged module.

FIG. 27 is a schematic diagram of another embodiment of a packaged module 980. The packaged module 980 of FIG. 27 is similar to the packaged module 900 of FIG. 25A-25B, except that the packaged module 980 further includes an IPD 909 attached to the packaging substrate 920. Additionally, the power amplifier 911 is formed on the semiconductor die 972, and the power splitter/combiner 907 is formed on the IPD 909.

Figure 28A:
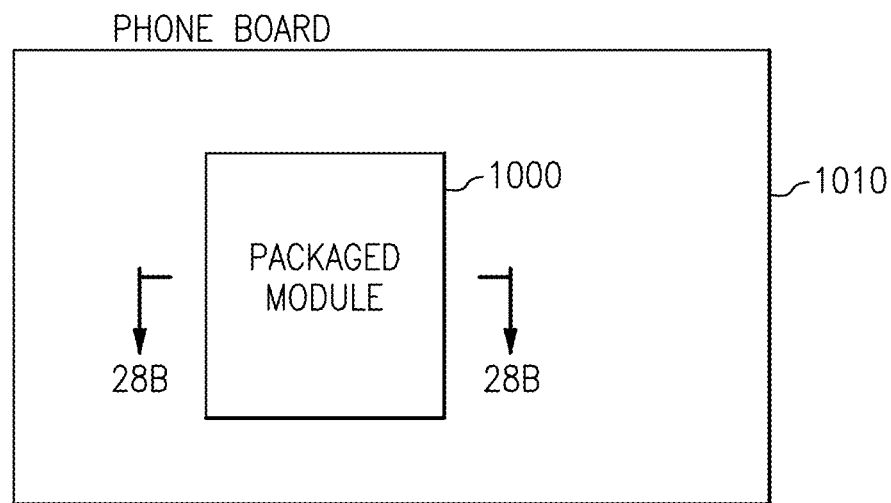
FIG. 28A is a schematic diagram of one embodiment of a phone board.
Figure 28B:
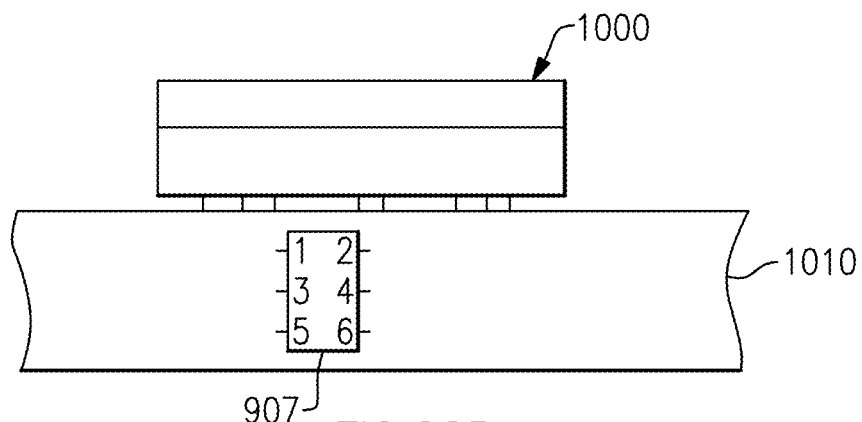
FIG. 28B is a schematic diagram of a cross-section of the phone board of FIG. 28A taken along the lines 28B-28B.

FIG. 28A is a schematic diagram of one embodiment of a phone board 1010. FIG. 28B is a schematic diagram of a cross-section of the phone board 1010 of FIG. 28A taken along the lines 28B-28B.

As shown in FIGS. 28A and 28B, the phone board 1010 includes a packaged module 1000 attached thereto. Connecting the packaged module 1000 in this manner facilitates communication with other electronics on the phone board 1010.

In the illustrated embodiment, the power splitter/combiner 907 is implemented using the phone board 1010. For example, the power splitter/combiner 907 can include a pair of coils formed using adjacent conductive layers of the phone board 1010.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power combining system comprising:
a first amplifier;
a second amplifier; and
a power combiner including a first port, a second port coupled to an output of the first amplifier, a first conductive coil connecting the first port to the second port, a third port, a fourth port coupled to an output of the second amplifier, a second conductive coil connecting the third port to the fourth port and inductively coupled to the first conductive coil, a fifth port connected along the first conductive coil, a first capacitor coupled between the fifth port and a reference voltage, a sixth port connected along the second conductive coil, and a second capacitor coupled between the sixth port and the reference voltage.

2. The power combining system of claim 1 wherein the power combiner further includes a third capacitor connected between the first port and the third port, and a fourth capacitor connected between the second port and the fourth port.

3. The power combining system of claim 1 wherein the first conductive coil and the second conductive coil are interleaved.

4. The power combining system of claim 1 wherein the first port and the third port are directly adjacent to one another with no intervening ports, and the second port and the fourth port are directly adjacent to one another with no intervening ports.

5. The power combining system of claim 1 wherein the fifth port is directly adjacent to the third port with no intervening ports, and the sixth port is directly adjacent to the fourth port with no intervening ports.

6. The power combining system of claim 1 wherein the first port, the third port, and the fifth port are aligned on a first side of the power combiner, and the second port, the fourth port, and the sixth port are aligned on a second side of the power combiner opposite the first side.

7. The power combining system of claim 1 wherein the first amplifier corresponds to a carrier amplifier and the second amplifier corresponds to a peaking amplifier.

8. The power combining system of claim 1 wherein the reference voltage is ground.

9. The power combining system of claim 1 wherein the fifth port taps a center of the first conductive coil, and the sixth port taps a center of the second conductive coil.

10. A mobile device comprising:
a transceiver configured to generate a radio frequency signal; and
a front-end system including a first amplifier configured to amplify the radio frequency signal, a second amplifier configured to amplify the radio frequency signal, and a power combiner including a first port, a second port coupled to an output of the first amplifier, a first conductive coil connecting the first port to the second port, a third port, a fourth port coupled to an output of the second amplifier, a second conductive coil connecting the third port to the fourth port and inductively coupled to the first conductive coil, a fifth port connected along the first conductive coil, a first capacitor coupled between the fifth port and a reference voltage, a sixth port connected along the second conductive coil, and a second capacitor coupled between the sixth port and the reference voltage.

11. The mobile device of claim 10 further comprising an antenna configured to receive a combined radio frequency signal from the first port of the power combiner.

12. The mobile device of claim 10 wherein the power combiner further includes a third capacitor connected between the first port and the third port, and a fourth capacitor connected between the second port and the fourth port.

13. The mobile device of claim 10 wherein the first conductive coil and the second conductive coil are interleaved.

14. The mobile device of claim 10 wherein the first port and the third port are directly adjacent to one another with no intervening ports, and the second port and the fourth port are directly adjacent to one another with no intervening ports.

15. The mobile device of claim 10 wherein the fifth port is directly adjacent to the third port with no intervening ports, and the sixth port is directly adjacent to the fourth port with no intervening ports.

16. The mobile device of claim 10 wherein the first port, the third port, and the fifth port are aligned on a first side of the power combiner, and the second port, the fourth port, and the sixth port are aligned on a second side of the power combiner opposite the first side.

17. The mobile device of claim 10 wherein the first amplifier corresponds to a carrier amplifier and the second amplifier corresponds to a peaking amplifier.

18. The mobile device of claim 10 wherein the fifth port taps a center of the first conductive coil, and the sixth port taps a center of the second conductive coil.

19. A method of power combining in a mobile device, the method comprising:
inductively coupling a first conductive coil of a power combiner to a second conductive coil of the power combiner, the first conductive coil connecting a first port to a second port and the second conductive coil connecting a third port to a fourth port;
providing a first radio frequency signal to the second port using a first amplifier;
providing a second radio frequency signal to the fourth port using a second amplifier;
tuning the power combiner using a first capacitor coupled between a fifth port of the power combiner and a reference voltage, the fifth port connected along the first conductive coil; and
tuning the power combiner using a second capacitor coupled between a sixth port of the power combiner and the reference voltage, the sixth port connected along the second conductive coil.

20. The method of claim 19 further comprising generating a combined radio frequency signal at the first port, and transmitting the combined radio frequency signal on an antenna.

* * * * *